United States Patent [19]
Guo

[11] Patent Number: 5,400,370
[45] Date of Patent: Mar. 21, 1995

[54] ALL DIGITAL HIGH SPEED ALGORITHMIC DATA RECOVERY METHOD AND APPARATUS USING LOCALLY GENERATED COMPENSATED BROAD BAND TIME RULERS AND DATA EDGE POSITION AVERAGING

[75] Inventor: Bin Guo, Fremont, Calif.

[73] Assignee: Advanced Micro Devices Inc., Sunnyvale, Calif.

[21] Appl. No.: 21,924

[22] Filed: Feb. 24, 1993

[51] Int. Cl.$^6$ .................. H04L 7/00; H04L 25/36; H04L 25/40

[52] U.S. Cl. .................. 375/118; 375/110; 375/113; 375/120

[58] Field of Search .................. 375/80, 81, 94, 95, 375/106, 110, 118–120, 111, 113; 331/1 R, 1 A, 14, 25; 307/511, 527; 328/201

[56] References Cited

U.S. PATENT DOCUMENTS

| | | | |
|---|---|---|---|
| 4,821,297 | 4/1989 | Bergmann et al. | 375/83 |
| 5,052,026 | 9/1991 | Walley | 375/119 |
| 5,208,839 | 5/1993 | Hladik et al. | 375/110 |

Primary Examiner—Stephen Chin
Assistant Examiner—Don N. Vo
Attorney, Agent, or Firm—Gerald Fisher

[57] ABSTRACT

An all digital data algorithmic recovery method and apparatus which operates at jitter greater than 25% and where run length is more than 1000 bits and which uses self calibrated delay elements to phase align a locally generated time ruler reference with the data average transition position to reliably establish the sampling time for retrieving data from an incoming binary sequence at the center of the data eye. The phase adjusted time ruler signal is used to sample transition positions of the data and the sampled data is statistically analyzed in a state machine wherein the time ruler is a broadband signal comprising a first and second base frequency and wherein the period of one of said frequencies is $$\frac{1}{F_R - F_T}$$

where $F_R$ equals the receiver local clock frequency and $F_T$ equals the frequency of the distant clock.

11 Claims, 28 Drawing Sheets

|  | 111 | 112 | 113 | 114 | 115 |
|---|---|---|---|---|---|
|  | (I - O)<br>I: inner zone<br>O: outer zone | (E - L)<br>E: early<br>L: later | (B-S)<br>B: both or none<br>S: single | RISING EDGES | FALLING EDGES |
| (A) | <br>I >> O | <br>E = L | <br>B<<S | <br>RE>>RL | <br>FE<<FL |
| (B) | <br>I = O | <br>E << L | <br>B<S | <br>RE<<RL | <br>FE<<FL |
| (C) | <br>I << O | <br>E = L | <br>B>>S | <br>RE<<RL | <br>FE>>FL |
| (D) | <br>I = O | <br>E >> L | <br>B<S | <br>RE>>RL | <br>FE>>FL |
FIG. 4b

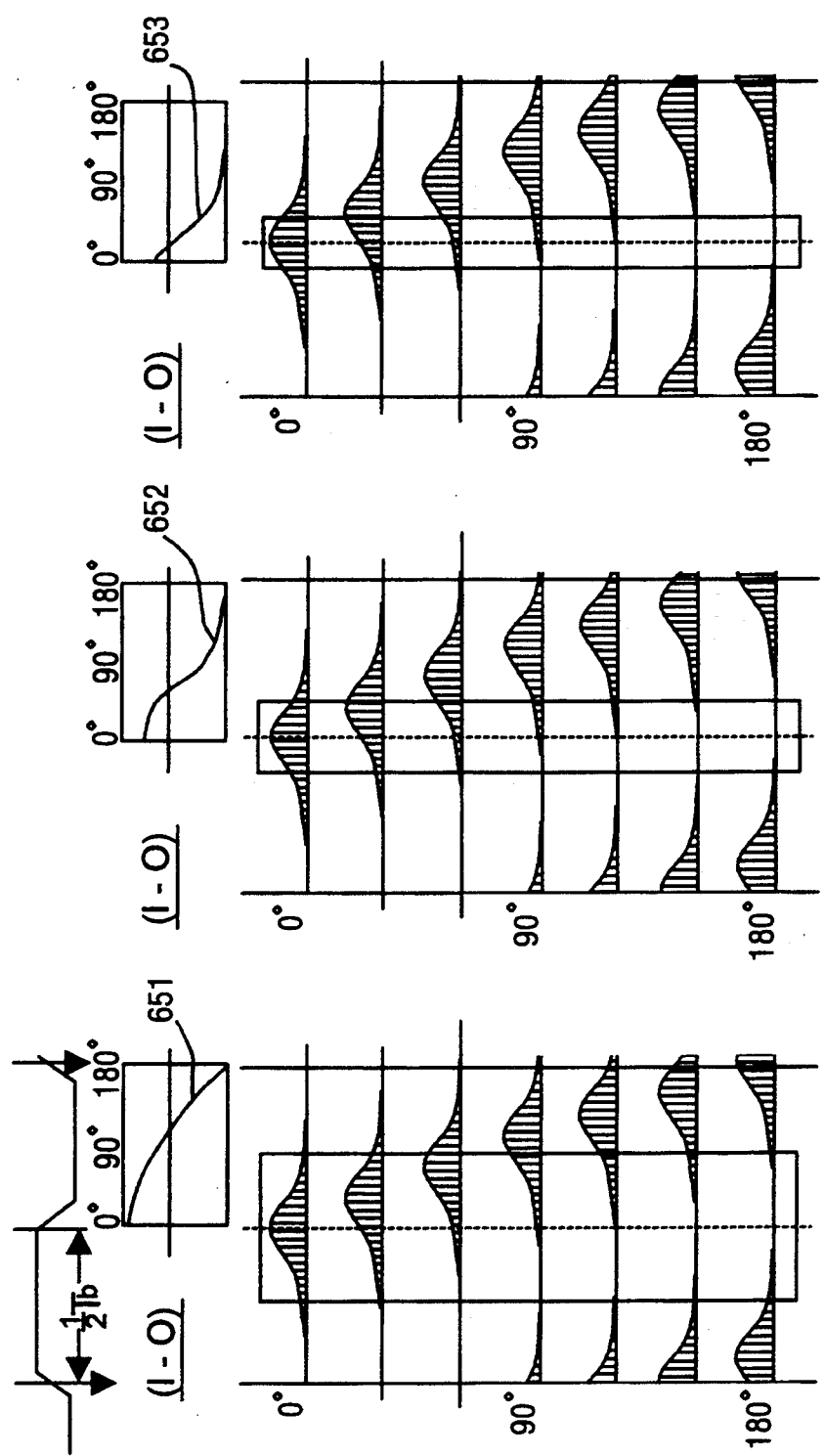

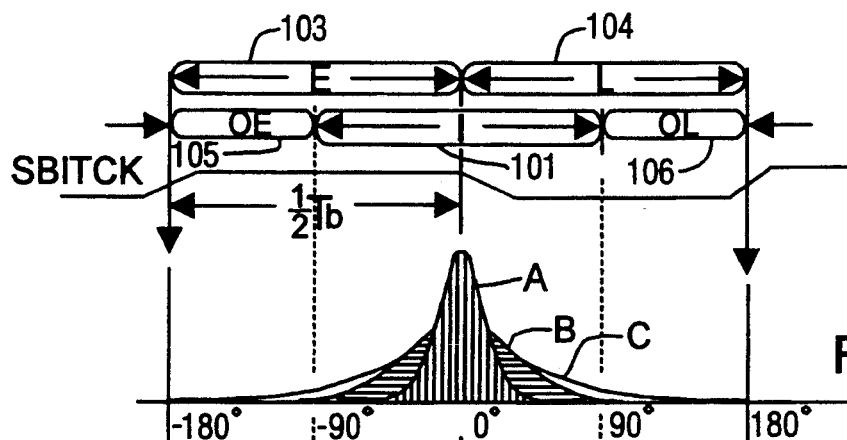
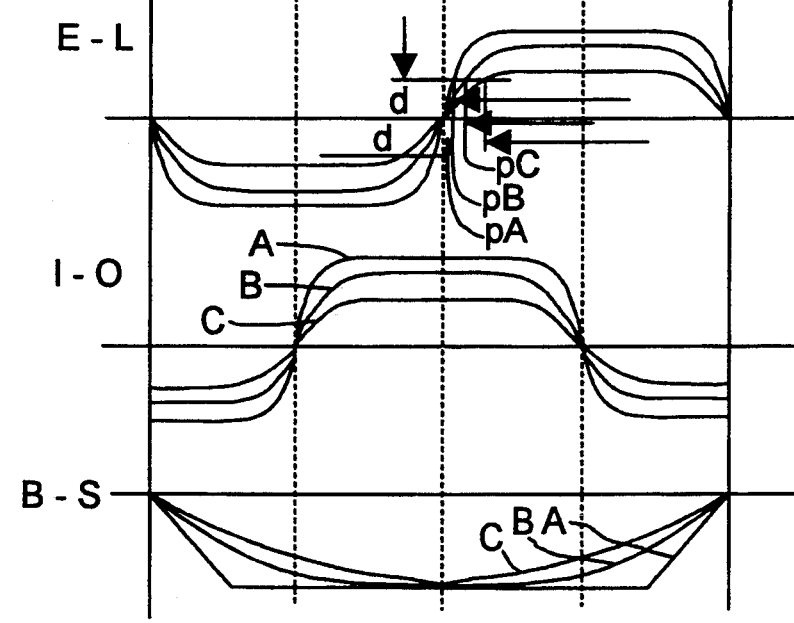
FIG. 9a
FIG. 9b
FIG. 9c
FIG. 9d
FIG. 9e

| Phase diff bet. data and SBITCK | -180° | | -90° | | 0° | | 90° | | 180° |
|---|---|---|---|---|---|---|---|---|---|
| | | Q3 | | Q4 | | Q1 | | Q2 | |
| E-L | ~0 | <0 | -P | <0 | ~0 | >0 | +P | >0 | ~0 |
| | | ↘ | | ↗ | | ↗ | | ↘ | |
| I-O | -P | <0 | ~0 | >0 | +P | >0 | ~0 | <0 | -P |
| | | ↗ | | ↗ | | ↘ | | ↘ | |
| B-S | +P | ↘ | | ↘ | -P | ↗ | | ↗ | +P |
| UPDNEN | 1 ||| 0 ||| 1 |||
| UPDN | 1 ||| X ||| 0 |||
| FS | 1 | 0 || 0 || 0 || 1 ||

FIG. 10

| | | INPUTS | | | | | | | | | OUTPUTS | | | | ADJUST MODE |
|---|---|---|---|---|---|---|---|---|---|---|---|---|---|---|---|
| | 901 | 902 | 903 | 904 | 905 | 906 | 907 | 908 | 909 | 910 | 911 | 912 | 913 | 914 | 915 |
| STATUS | XD | XD3 | XD1 | XWC | XU1 | XU3 | XU | XDN | IN LOCK | XUP | FS | UD | ROTEN | RESTART | |
| (a) INCDLY | 0 | 0 | 0 | 0 | 0 | 0 | 1 | 0 | 0 | 1 | 1 | 1* | 1* | 0 | INC-FAST |
| (b) | 0 | 0 | 0 | 0 | 1 | 1 | 1 | 0 | 0 | 1 | 0 | 1* | 1* | 0 | INC-SLOW |
| (c) | 0 | 0 | 0 | 1 | 1 | 1 | 1 | 0 | 0 | 1 | 0 | | | | |
| (d) IN-LOCK | 0 | 0 | 1 | 1 | 1 | 1 | 0 | 0 | 1 | 0 | 0 | NC | 0 | 0 | NO CHANGE |
| (e) | 0 | 0 | 1 | 1 | 1 | 0 | 0 | 0 | 1 | 0 | 0 | NC | 0 | 0 | |
| (f) DECDLY | 1 | 1 | 1 | 0 | 0 | 0 | 0 | 1 | 0 | 0 | 0 | 0* | 1* | 0 | DEC-SLOW |
| (g) | 1 | 1 | 0 | 0 | 0 | 0 | 0 | 1 | 0 | 0 | 0 | | | | |
| (h) | 1 | 0 | 0 | 0 | 0 | 0 | 0 | 1 | 0 | 0 | 1 | | | | DEC-FAST |
| (i) ERROR | – | 1 | 0 | 0 | – | 1 | – | 0 | 0 | 0 | 1 | NC | NC | 1* | RESET |
| (j) | – | 1 | 0 | 0 | – | 0 | – | 0 | 0 | 0 | 1 | | | | |
| (k) LOCKED ON 2X | 1 | 1 | 1 | 1 | 1 | 0 | 0 | 0 | 0 | 0 | 1 | NC | 0 | 1* | |

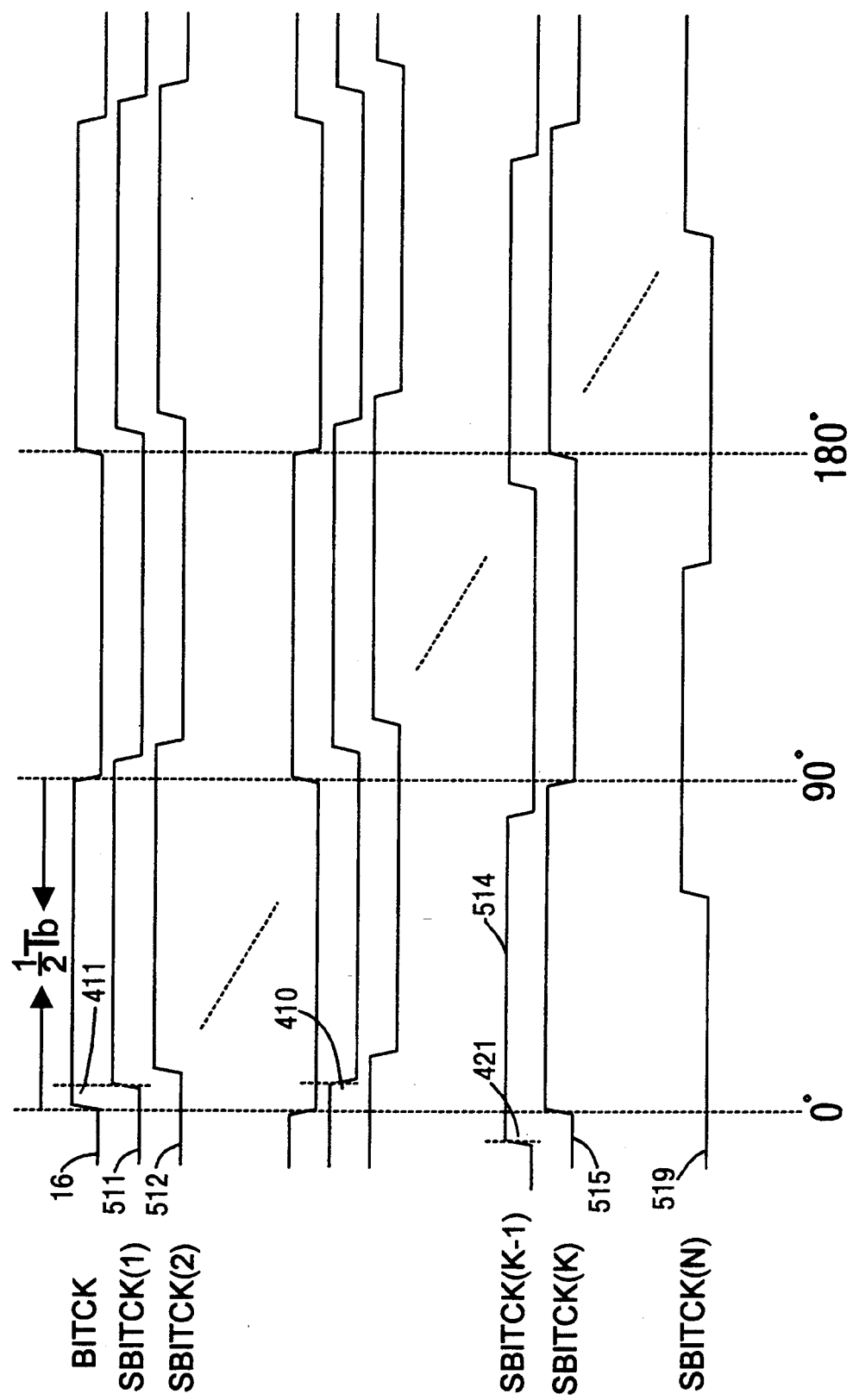

| | | | | | | | | |
|---|---|---|---|---|---|---|---|---|
| (A) | $S(l)_{(n+1)} = S(l-1)_{(n)} \overline{UPDN} + S(l+1)_{(n)} UPDN$ | | | | | | ($l = 1,..., J-1$) | |
| (B) | $S(l)_{(n+1)} = S(l-1)_{(n)} \overline{C(l-1)_{(n)}} \overline{UPDN} + [S(l+1)_{(n)} \overline{C(l)_{(n)}} + S(0)_{(n)} C(l)_{(n)}] \overline{UPDN}$ | | | | | | ($l = J,..., N$) | |
| (C) | $WA(l)_{(n+1)} = S(l-1)_{(n)} C(l)_{(n)} \overline{UPDN}$ | | | | | | ($l = J,..., N$) | |

| | | $S(l)_{(n)}$ | $S(l-1)_{(n)}$ | $S(l+1)_{(n)}$ | UPDN | $C(l-1)_{(n)}$ | $C(l)_{(n)}$ | $S(l)_{(n+1)}$ | $WA(l)_{(n+1)}$ |
|---|---|---|---|---|---|---|---|---|---|
| 701 | NORMAL UP-SHIFT "0" | X | 0 | X | 1 | 0 | 0 | 0 | 0 |
| 702 | UP ADJ NORMAL UP-SHIFT "1" | X | 1 | X | 1 | 0 | 0 | 1 | 0 |
| 703 | "WRAP AROUND" "0" TO ST(1) | X | 0 | X | 1 | 0 | 1 | 0 | 0 |
| 704 | "WRAP AROUND" "1" TO ST(1) | X | 1 | X | 1 | 0 | 1 | 1 | 1 |
| 704' | REJECT "1" AT STAGE FOLLOWING ESP | X | X | X | 1 | 1 | 0 | 0 | 0 |
| 705 | NORMAL DOWN-SHIFT "0" | X | X | 0 | 0 | X | 0 | 0 | X |
| 706 | DN ADJ NORMAL DOWN-SHIFT "1" | X | X | 1 | 0 | X | 0 | 1 | X |
| 707 | "WRAP AROUND" "0" TO ST(K) | 0 | X | X | 0 | X | 1 | 0 | X |
| 708 | "WRAP AROUND" "1" TO ST(K) | 1 | X | X | 0 | X | 1 | 1 | X |

FIG. 21

ALL DIGITAL HIGH SPEED ALGORITHMIC DATA RECOVERY METHOD AND APPARATUS USING LOCALLY GENERATED COMPENSATED BROAD BAND TIME RULERS AND DATA EDGE POSITION AVERAGING

FIELD OF INVENTION

This invention relates to digital algorithmic data recovery for serial data transmit/receive systems and particularly to an all digital method and apparatus for edge position averaging and data/clock synchronization.

RELATED APPLICATIONS

The applicant has simultaneously filed the following patent applications, which are incorporated herein by reference and which relate to aspects of my high data rate digital data/clock recovery system: (1) "Digital Full Range Rotating Phase Shifter," Ser. No. 08/021,691, filing date Feb. 24, 1993, inventor Bin Guo, AMD Docket Number A894; "Digital Variable In-Lock Range Phase Comparator," Ser. No. 08/021,712, filing date Feb. 24, 1993, inventor Bin Guo, AMD Docket Number A911.

In addition, applicant is an inventor or a co-inventor on the following commonly assigned patent applications, which relate to aspects of the data recovery system of this application, said applications are also incorporated herein by reference:

1. "DIGITAL DATA RECOVERY USING DELAY TIME RULERS", Bin Guo et al. Ser. No. 07/901,335; Jun. 19, 1992, AMD docket #A860.
2. "DIGITAL JITTER CORRECTION METHOD AND SIGNAL PRECONDITIONER", Bin Guo, Ser. No. 07/901,360; Jun. 19, 1992, AMD docket #A862.
3. "DIGITAL SERIALIZER AND TIME DELAY REGULATOR", Bin Guo, Jun. 19, 1992, AMD docket #A865, Ser. No. 07/901,312.

BACKGROUND OF THE INVENTION

In serial data transmit/receive systems, the clock information which provides the correct timing for data recovery is generally embedded in the data stream and there is no separate line or channel to carry a clock signal to the receiver. Clock frequency recovery and phase alignment with data is generally performed before the received data can be recovered and de-serialized. Traditionally, a Phase Locked Loop (PLL) is employed, in which the frequency of a Voltage Controlled Oscillator (VCO) is adjusted responsive to the incoming data frequency. The phase acquisition can be accomplished by the same phase locked lccp, or by a separate phase locked lccp depending on whether a single or a multi-loop system is used. The PLL detects the phase error of the recovered clock, or the phase difference between the output of the VCO and the incoming data and generates an error signal which is filtered and converted to a control voltage to drive the VCO to reduce the phase difference. When the phase difference of the two is eliminated or becomes a constant, the VCO output is truly a retimed clock since it has an established, known phase in relation to the data. In practice, the data is often contaminated with various types of noises such that timing or phase jitter is present. The edges i.e., the transitions, in the data stream do not always arrive perfectly in time, but rather at different "early" or "late" times, causing timing noise known as phase or timing jitter. Incorrect phase errors are detected and adjustments to the VCO control are still attempted even if the VCO frequency is the same or very close to the data frequency. The PLL is designed to reduce the effect of such jitter sources in the high frequency range by employing low pass filter such that the jitter of the recovered clock is limited and good stability of the lccp achieved. However, heretofore this has been accomplished by introducing other problems. The control voltage to the VCO is susceptible to internally generated switching noise which is more serious when the operating frequency increases. The low pass filter function often employs components such as large values capacitors and resistors. These and other factors have made the monolithic integrated circuit implementation costly, especially when integrated with large scale, dense digital functions. Therefore, an all digital solution is highly desirable especially as feature dimensions of integrated circuits becomes smaller such that a complicated logic function may use smaller die area than even a single capacitor component.

In many prior art digital data recovery approaches, an adjustable bias voltage or current is employed to adjust the delay value of a delay unit in a ring oscillator to achieve frequency tuning or to adjust phase to match that of the incoming data. In these and other prior approaches, the techniques are generally specified for a certain data format, coding format, jitter tolerance or operation frequency. In a pending application "Digital Data Recovery Using Delay Time Rulers," assigned to the same assignee AMD Docket Number A860, Ser. No. 07/901,335 filed Jun. 19, 1992, data recovery is based on a discrete delay time rulers used for bit interval measurement. The time ruler in this earlier invention is generated from a local frequency reference source and possesses the correct frequency information for data recovery. However, the time ruler for subsequent bit time interval measurements is initiated upon the arrival of a data transition. Since the data are assumed to have a maximum edge-to-edge jitter of +/−25% of the bit period, the jitter tolerance for such a system is reduced to the same range. In another pending application "Digital Jitter Correction Method and Signal Preconditioner," also assigned to the same assignee, AMD Docket Number A862, Ser. No. 07/901,360 filed Jun. 19, 1992, jitter contributed from DCD (Duty Cycle Distortion) is detected and compensated using an all digital algorithmic method. Peak-to-peak jitter of an DCD compensated system with this approach may be reduced to less than +/−25% even when the original unadjusted peak-to-peak jitter is larger than +/−25%. However, the DCD compensation technique has a minimum improvement on jitter reduction if the DCD jitter is not dominant. A limitation of our previous time ruler data recovery scheme of our earlier filed application is that is restricted to short run length NRZI data. For long run length NRZI data stream, (consecutive data bits without transition), the accumulated timing error will eventually cause a failure since a finite error of the time ruler (or the delay value of the time ruler delay element) is always present; in other words, the jitter tolerance of my earlier system diminishes as the data run length increases. Since the design of some coding systems limit the run length of the encoded data, i.e. 4B/5B code used in Fiber Distributed Data Interface (FDDI), and the 8B/10B code used in FC (Fiber Channel), our earlier system was useful. However, other coding systems such as the systems using scrambled data, may not guarantee the run length limit. A need exists to have a general, all digital, time ruler based data recovery scheme which has much larger jitter tolerance than +/−25% of the bit period, and which does not deteriorate for longer run length, irrespective of the data or coding format employed.

SUMMARY OF THE INVENTION

A principal objective of the present invention is to provide a general, all digital data recovery method and scheme, which retains its benefits without requiring any specific data or coding format, and which can be implemented and operated for high speed data transfer.

A further objective of the invention is to provide a digital scheme for data recovery that detects and locates the average transition position of an incoming serial data in respect to a locally generated time ruler reference to establish a correct phase relationship between the incoming data and the local time reference.

A still further objective of the invention is to use time-calibrated delay elements, or the time ruler based reference, instead of the analog, PLL based systems for data recovery.

A still further objective of the invention is to provide a method to phase align the locally generated time ruler reference with the data average transition position such that the time ruler measurement is initiated at the most appropriate position to obtain maximum jitter tolerance.

A still further objective of the invention is to produce a combined, so called "integrated time ruler" which is a signal combination of a local reference clock signal from a local frequency source and local time rulers, where the time rulers are generated from time-regulated delay elements, which technique greatly reduces the accumulated error of the time ruler measurement such that the run length of the data can be extended to more than 1000 bits.

A still further objective of the invention is to have a complete data recovery scheme which is suitable for digital integrated circuit implementation.

GENERAL DESCRIPTION OF THE INVENTION

A signal representing a "compensated broadband time ruler," is phase-aligned with the detected and averaged data transition position. The compensated broadband time ruler is used as the recovered timing signal for reading and retrieving the data from an incoming serial binary sequence. Delay elements for generating the time ruler can be the same as those described in pending application, "Digital Serializer and Time Delay Regulator" assigned to the same assignee AMD Docket Number A865, Ser. No. 07/901,312, filed Jun. 19, 1992. The incoming data could be preconditioned by passage through a digital jitter correction and signal pre-conditioner as described in pending application "Digital Jitter Correction Method and Signal Preconditioner," AMD Docket A862, Ser. No. 07/901,360, filed Jun. 19, 1992. The data could be sampled while traveling through a delay line comprising two time ruler elements. Each time ruler element has a nominal delay value equal to one half of the data bit period. The signal representing the integrated time ruler is first passed through a digital up/down phase shifter. The phase adjusted time ruler signal is then used to sample or register each data edge or transition position into a set of registers. If the signal of the integrated time ruler is properly aligned with the data, the timing edge of the time ruler signal should be aligned with the position known as the center of the "data eye". The center of the edge distribution of the average transition position is one-half bit interval from the eye center. If, however, the two are not aligned properly, a different set of registered data would be presented in the register sets. By observing and analyzing the sampled data in the register sets, information regarding the phase relation between the compensated integrated time ruler signal and the incoming data can be acquired. An up/down signal is then generated in a Phase Adjust Decision block to inform a rotating phase shifter to make adjustment such that the phase difference is reduced. This process continues until the phase relation of the two reaches a prespecified condition.

By combining the reference frequency and a time ruler signal which is real time calibrated to be a multiple of the reference frequency to form the compensated broadband time ruler we achieve the ability to remain properly frequency locked even for large extended run length on the incoming data. The signal representing the compensated broadband time ruler is not a regular clock signal since it is not a single frequency periodic signal, but rather a signal with two base frequencies: the reference clock frequency, and the frequency derived from the reference frequency using the delay time ruler technique. To be able to correct for a extended run length, the frequency, or the bit period accuracy, becomes crucial. In the time ruler data recovery method described in the referenced above co-pending application "Digital Data Recovery Using Delay Time Rulers," Ser. No. 07/901,335 filed Jun. 19, 1992, the time lapse of the "period" of the time ruler is determined by the regulated delay elements. There is always a finite time error in such delay elements, depending also on the achievable delay adjustment resolution. For the same achievable adjustment resolution, the percentile error becomes larger as data rate increases and bit period decreases. The accumulated error can become very significant if time rulers with the same time error are simply "cascaded". The absolute as well as the relative error grows as the run length grows. One corrective method for such error would be to "compensate" the error periodically, before it becomes too big. This, of course, requires another time ruler or time reference with much higher timing accuracy. In fact, a local frequency reference source, which may run only at one Nth of the data frequency, can have much higher accuracy. Many systems including the FDDI standards specify that the local frequency source at the receiver end is allowed to have maximum frequency offset +/−50 ppm (parts per million) with respect to the frequency source on the transmitter end (or the incoming data frequency). For +/−50 ppm accuracy (which is not difficult to achieve with modern crystal oscillator technology), less than +/−1% timing error would occur for the accumulation of 200 cycles of the reference clock, or 200×N bit periods. The accumulated time error from a cascaded time ruler for so many cycles would be much larger. My solution is to use the local reference clock signal (known as the parallel data clock or byte clock) to correct the delay generated time ruler. Assume that the reference clock signal is 1/N times the data rate, so that N time ruler periods at the incoming data frequency are generated within a reference clock (byte clock) period, and assume that each time ruler period has a timing error of +Te, then at the end of the Nth time ruler period, a total time error of +(N×Te) is accumulated. However, if the last time ruler period in each byte is modified by the amount of −(N×Te), the time error is fully compensated. By using my "Compensated broadband time ruler" concept, the method of this invention allows the data run length to exceed thousands of bits without causing an error in recovered data.

DRAWINGS

FIGS. 4a and 4b show timing diagrams and analysis used in the phase adjustment decision function.

FIGS. 5a, 5b, 5c through 8a, 8b and 8c are illustrative diagrams analyzing the I-O test method.

FIGS. 9a through 9e are illustrative summary diagrams analyzing the distribution test method for different data transition distributions.

FIG. 10 is a chart showing the truth table combinations for generating the up/down commands in the phase adjust decision block.

FIG. 12 is the schematic for the Bit Serializer of FIG. 2a.

FIG. 13a is a block diagram for a ½ Tb delay element of FIG. 2a.

FIG. 13b is a schematic for the delay cell of the ½ Tb delay.

FIG. 14a is a block diagram of the Sampling Register of FIG. 2a.

FIG. 14b is a block diagram of the Ruler Adjustment Decision Circuit of FIG. 2a.

FIG. 14c is a timing diagram of the circuit of FIG. 14a.

FIG. 14d is the logic truth table analysis of the Status Decode Logic of FIG. 14b.

FIG. 17 is the timing diagram for FIG. 16.

FIG. 18b is the block diagram of an embodiment of a Phase Comparator of FIG. 18a.

FIG. 21 is the table and chart of equations and the truth table for FIG. 20.

DETAILED DESCRIPTION

Figure 1A:
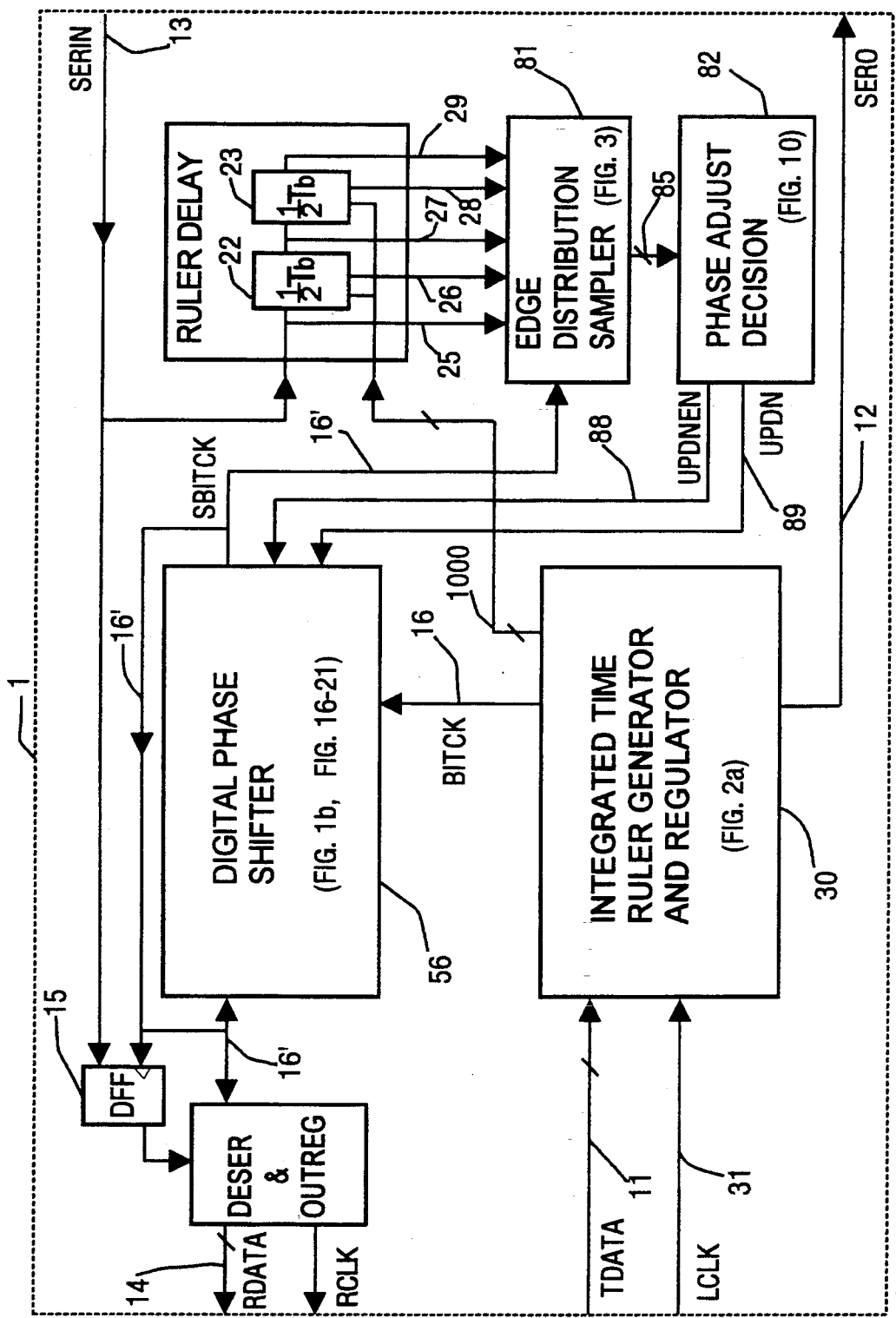
FIG. 1a is a functional diagram of a transceiver providing an all digital data recovery system employing a locally generated "Compensated broadband time ruler" and algorithmic data transition averaging.

FIG. 1a shows the overall block diagram of a data transceiver using locally generated compensated broadband time rulers and data transition averaging.

With reference to FIG. 1a, to transmit data, the transceiver 1 receives N-bit parallel data TDATA on bus 11, serializes it and transmits out the serialized data SERO on line 12. The transceiver receives the serial incoming data SERIN on line 13, recovers the data from the output of D flip-flop 15 using a recovered and retimed signal SBITCK 16′ representing a phase-shifted copy of the compensated broadband time ruler on line 16. The deserialized N-bit parallel data as the recovered data RDATA are sent out on line 14. A reference frequency source generated clock signal LCLK as the local clock running at 1/N of the data frequency is taken in on line 31. The accuracy of the LCLK or its frequency is specified in respect to the clock frequency of the remote transmitter/receiver. A "compensated broadband" time ruler signal BITCK 16, equivalent to a bit-rate clock, is generated in the compensated broadband Time Ruler Generator and Regulator block 30, and output on line 16. This signal is then sent to digital adjustable delay 50, FIG. 16 of the Digital Phase Shifter 56 in which phase shifting is performed, and from which the phase adjusted integrated time ruler signal SBITCK is output on line 16′. The BITCK signal is generated from a local frequency reference source LCLK which has no certain phase relation with the incoming serial data SERIN on line 13 and thus can not be directly used to read or sample the data. The serial incoming data SERIN on line 13 may be preconditioned, FIG. 1b, to compensate duty cycle distortion by signal pre-conditioner 20′, so that the preconditioned incoming data is available on line 13′. Alternatively, the serial incoming data SERIN can be directly applied to the D input of D flip-flop 15 for data recovery, via connector 13″ since this scheme has large jitter tolerance and data can be reliably recovered even in the presence of the duty cycle distortion jitter. In the latter case, only the two ½ Tb time ruler delay elements 22 and 23 in Ruler Delay 20 are needed. The serial incoming data on line 13″ is sent to the cascaded time ruler delay 22 and 23, each of which delays for a time lapse equal to half of the bit period. The edge distribution sampler 81 samples the level status of nodes 25 through 29 to capture the location of data transitions while the data signal wave is traveling in time ruler delays. Different distribution patterns on nodes 25–29 will be observed if the sampling takes place at different phase instances. In this arrangement, the phase adjusted signal SBITCK 16′ is used to strobe the sampler for capturing the status of the transitions. Since SBITCK 16′ is also used as the clocking signal for D flip-flop 15 for reading the data on line 13″, the most appropriate phase relation of SBITCK and the incoming data SERIN is that the SBITCK sampling edge is aligned with the center of the data eye. If no time jitter is present in the incoming data, all data transition should be captured at or in the neighborhood of node 27. In other words, if the clocking edge SBITCK is one half bit away from the SERIN data transition in time, it is called "phase in lock". In practice, there are always timing jitters associated with data edges. Distributed edges should be observed if a certain number of edges are captured. The sampled edge distribution information is sent to the phase adjust decision block 82 via bus 85. The captured distribution data are analyzed and decisions are made in block 82 to inform the rotating phase shift control 56 of the direction of the phase error. If the retimed or phase adjusted clock signal SBITCK is not aligned with the center of the data eye, commands are sent to the rotating phase shift control of the phase shifter 56, via line 88 UPDNEN (up/down adjustment enable) and 89 UPDN (up or down) to cause phase adjustments in steps. The process continues until phase alignment is achieved, and is resumed whenever a pre-specified phase error due to frequency drift occurs.

Figure 2A:
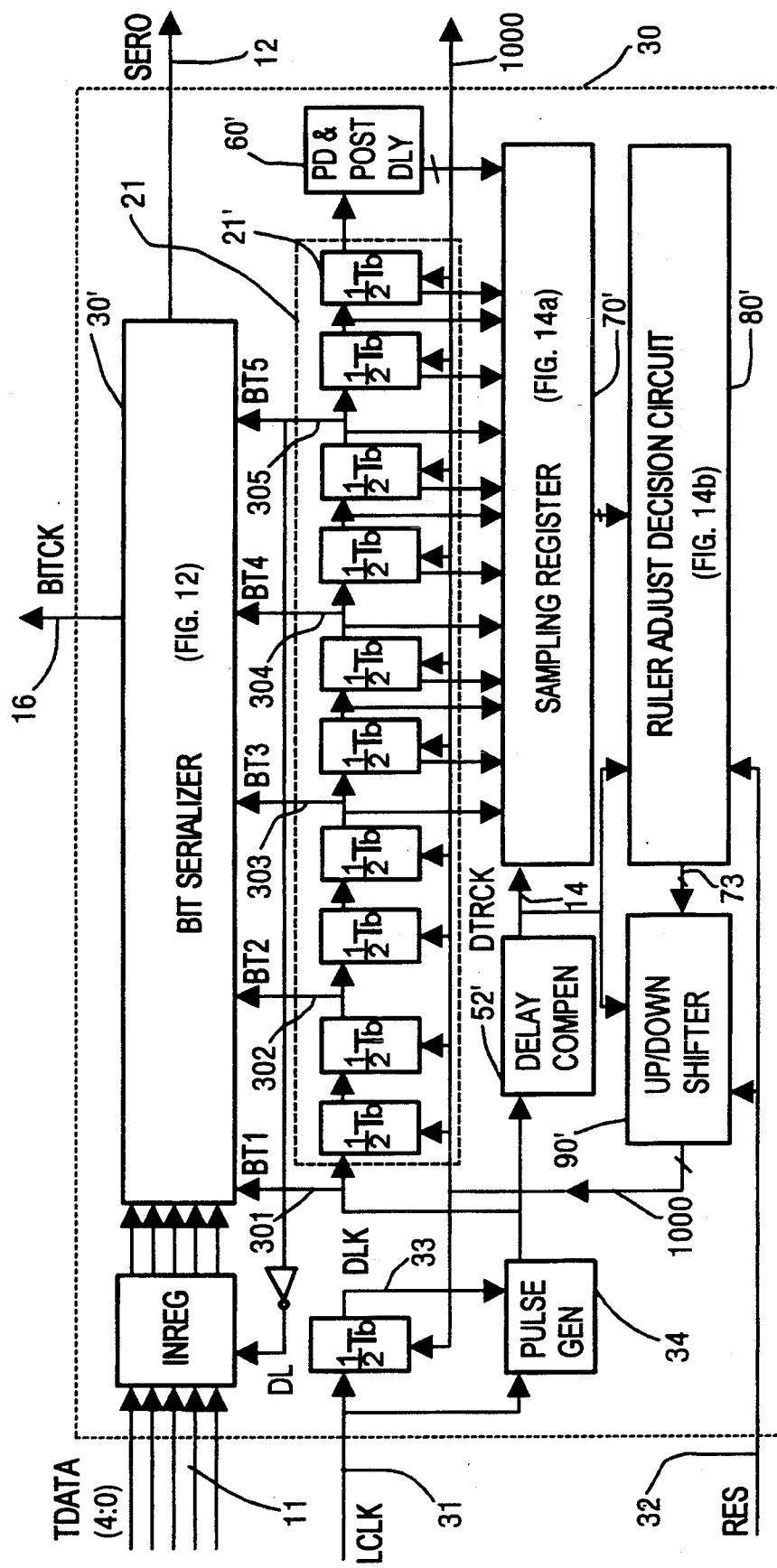
FIG. 2a is the block diagram of the Compensated Broadband Time ruler Generator and Regulator.
Figure 2B:
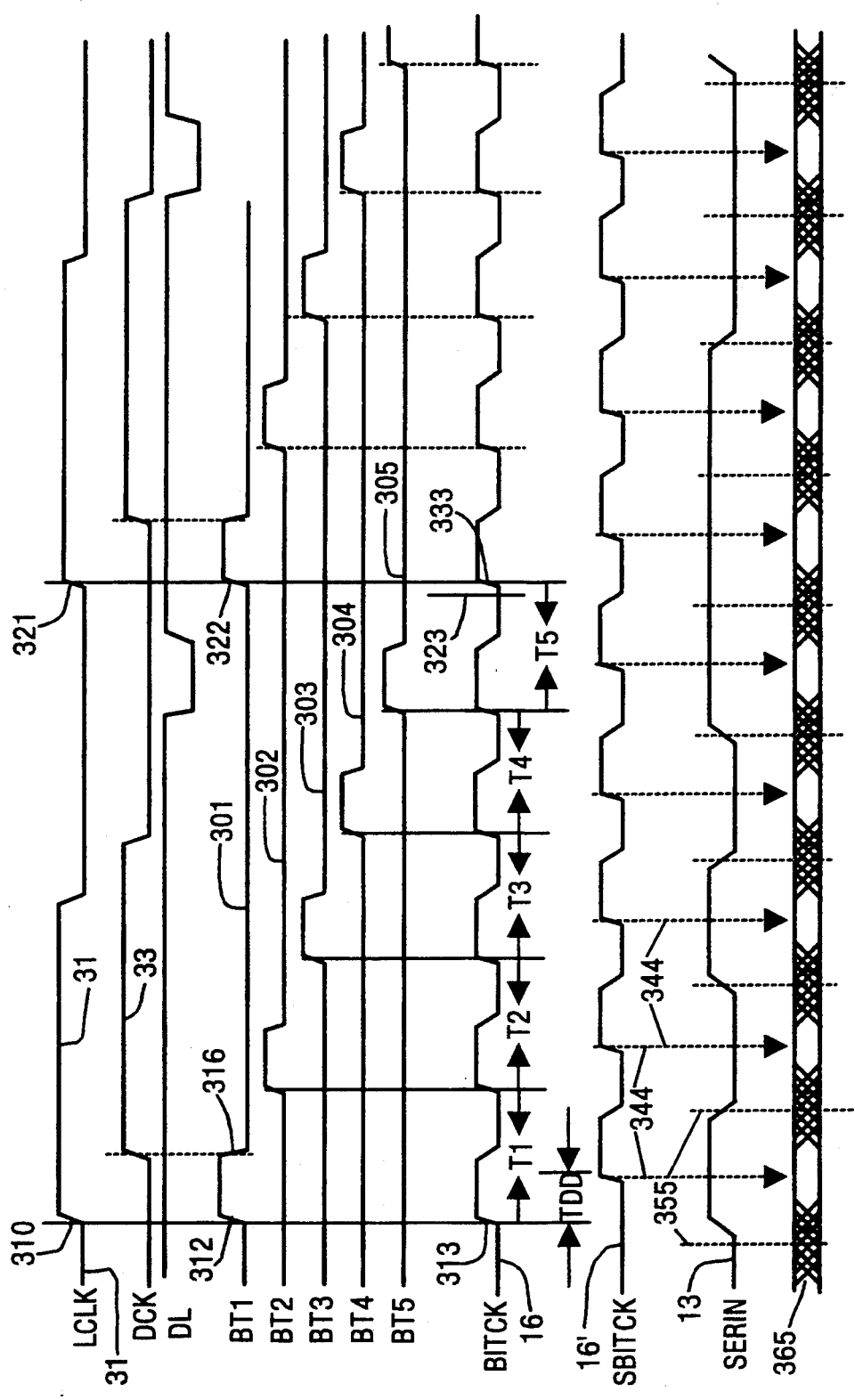
FIG. 2b is the timing diagram for FIG. 1a and FIG. 1b.

In FIG. 2a, a detailed block diagram is given for the Compensated Broadband Time Ruler Generator and Time Ruler Regulator 30. The function of the Time ruler Generator is more fully described in pending application "A Digital Serializer and Time Delay Regulator," AMD Docket Number A865, Ser. No. 07/901,312, filed Jun. 14, 1992. A plurality of cascaded adjustable delay elements 21' which each have delay of one-half $T_b$ are controlled by the up/down shifter 90' on bus 1000. With reference also to FIG. 2b, timing diagrams, it is seen how the Local Reference Clock LCLK controls the regulation and calibration of the time ruler delay elements 21 such that each delay element 21' exhibits the time lapse equal to half of the bit period. 5× frequency multiplication is assumed in this example. Pulse generator 34 provides pulse 312, 322, etc. at node BT1, 301, at every LCLK rising edge 310, 321, etc., to generated the rising edge of the pulse with width equal to half of the bit period. Pulse generator 34 FIG. 2a is responsive to the output on line 33 the first time ruler pulse which is subsequently delayed. The pulse generator 34 output is BT1. If the delay value of each ½ Tb delay element 21' is calibrated to its nominal value, at every bit interval, a delayed copy of this pulse is generated at nodes BT2, 302 through BT5, 305. These pulses are signals responsive to the time ruler which assist in determining the transmitted and serialized data frequency. The pulse is "traveling" in the serial delay line composed of several cascading such time ruler delay elements 21', generating pulses in every bit interval at nodes Bt1 through Bt5 and providing frequency information in our data recovery process. Error will accumulate as the number of such consecutive bit interval increases. I call this time ruler the "bit rate" time ruler, since it is produced from a "byte rate" reference frequency clock signal LCLK and which provides time measurement at bit resolution. If infinitely small delay adjustment could be achieved in the delay regulation process, or if N such bit rate time ruler lapses equaled exactly one byte rate time ruler from which they were generated, then the bit rate ruler could be used a large number of times. However, N times Tb is not equal to LCLK period due to the achievable adjustable timing resolution. In serial link data transmission and recovery, we use the recovered signal or time ruler to "measure" the time lapse in the absence of data transitions. If each time ruler had a 1% timing error, a one bit slip would occur after 100 bits. This is especially a problem in an all digital data recovery approach since only step or finite time or delay adjustment is available. However, the "byte rate" time ruler is very accurate and is not dependent on the adjustment resolution. The conventional accuracy of a crystal frequency source permits the use of the time measurement for hundreds of consecutive byte cycles without accumulating significant out of spec timing error. With reference to FIG. 2b, the signals from BT1,301 through BT5, 305 are combined in a logic OR circuit to produce a signal BITCK 16. I call the ORed output a "Compensated Broadband" time ruler, BITCK 16. I call it "compensated broadband" because it is a combination of two types of time rulers with different base frequency. Note from FIG. 2b, that the broadband time ruler BITCK 16 acts like a bit rate clock, but is different from a regular bit clock. In the timing diagram, the cycles of BITCK are 5 in a group. Cycle T1 through T4 are identical in time because they are generated from delaying a signal by identical bit delay time ruler elements, while cycle T5 may be different than the other four if a timing error of the time ruler exists. In a conventional clock, Period T5 would end at the time indicated by time line 323 if it was determined by delaying signal BT4 by a time ruler delay element. Actually, the rising edge of the 6th bit 333 is generated by edge 322, which is generated by the rising edge of the LCLK 31 at 321. There is a time gap between 323 and 333, which in fact is the accumulated timing error of the time rulers generated in period T1 and through T4. In terms of the time "measurement" of this example, bit time rulers are used for determining 4 bits within every 5 consecutive bits, while the byte rate time ruler is used to determine the rising transaction for the 5th bit. As a result, the frequency accuracy is only limited by the byte rate clock LCLK. With a given frequency offset specification of 100 ppm or so, data recovery using this type of compensated broadband time ruler can stand a run length of hundreds of byte times or thousands of bit period times, i.e. periods without a data transition.

The compensated broadband time ruler BITCK can be used to sample or recover the serial incoming data on line 13 only if its clocking edge can be aligned with the center of the data "eye", show in waveform 365. In FIG. 2b, BITCK 16 has to be delayed or phase shifted in the amount of Tdd to produce a phase shifted copy of the broadband time ruler SBITCK 16', the timing edge (rising edge) of which is aligned with the center of the data eye indicated by the dashed lines 344. When this alignment is accomplished, the time between the rising edge of the phase shifted SBITCK and the average data transition position should be half of the bit period as shown in time interval 366. If the phase adjusted or aligned SBITCK is used to "sample" or to "capture" the data transition positions, a edge distribution centered at half bit time away from the sampling instances indicated by dashed line 355 can be expected.

Figure 2C:
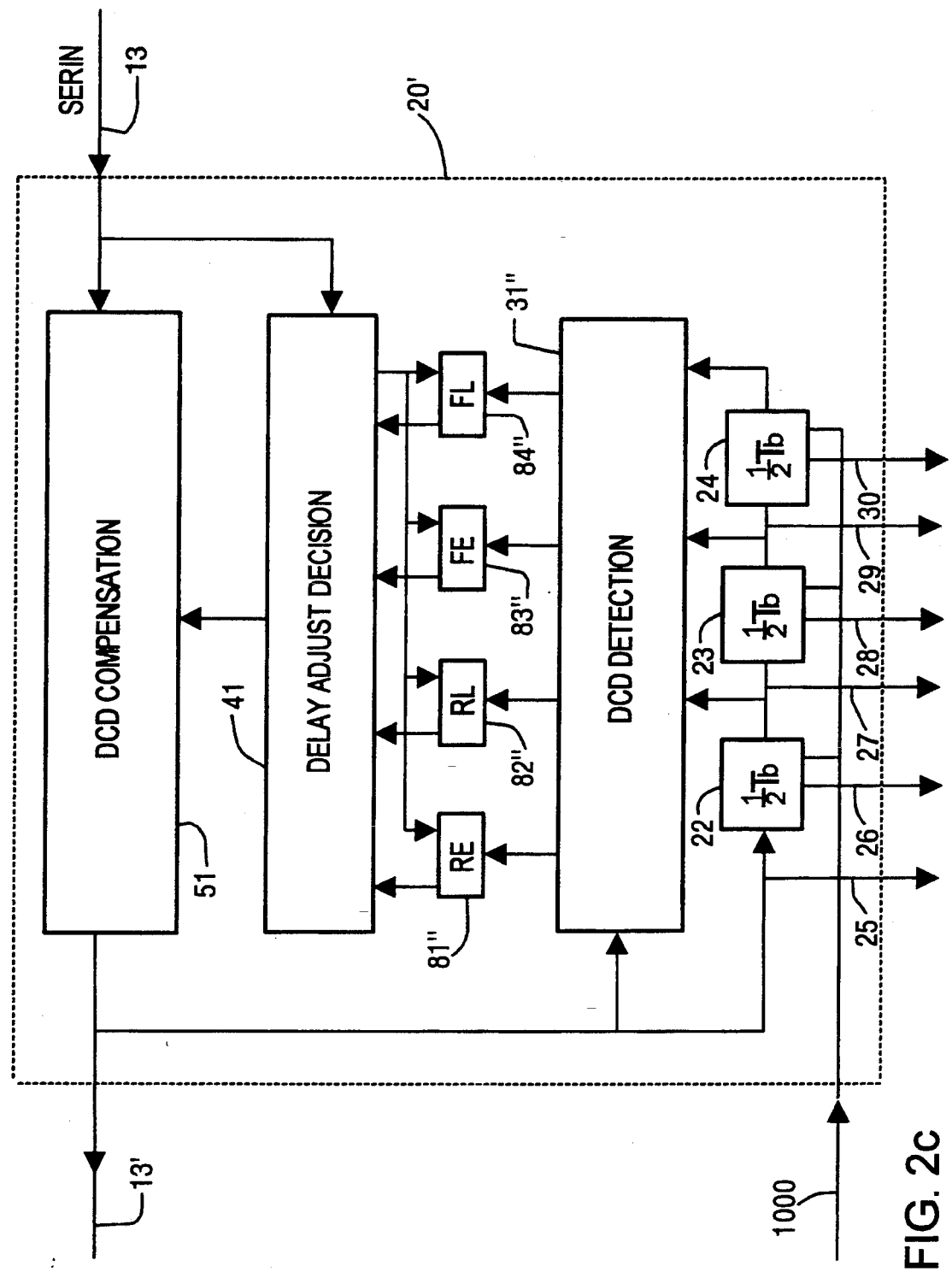
FIG. 2c is the block diagram of a DCD Preconditioner.

FIG. 2C is the block diagram of a DCD preconditioner. The function of the DCD compensator 20' is more fully described in pending application "Digital Jitter Correction Method and Signal Preconditioner," AMD docket number A862, Ser. No. 07/901,360, filed Jun. 19, 1992.

Figure 3:
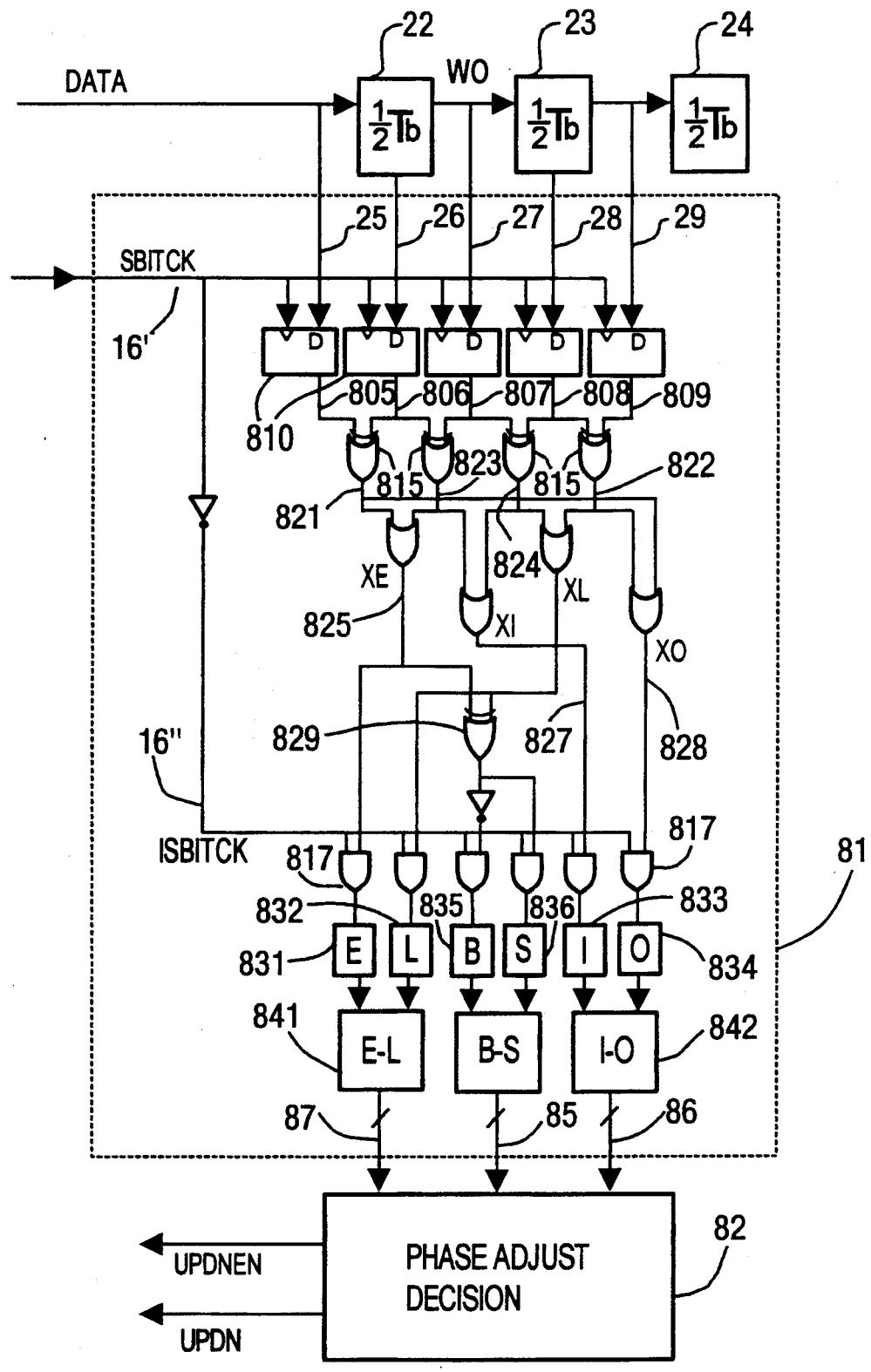
FIG. 3 is the block and logic diagram of one embodiment of the edge distribution sampler block of FIGS. 1a and 1b.

Edge Distribution Sampler (FIG. 3)

Figure 4A:
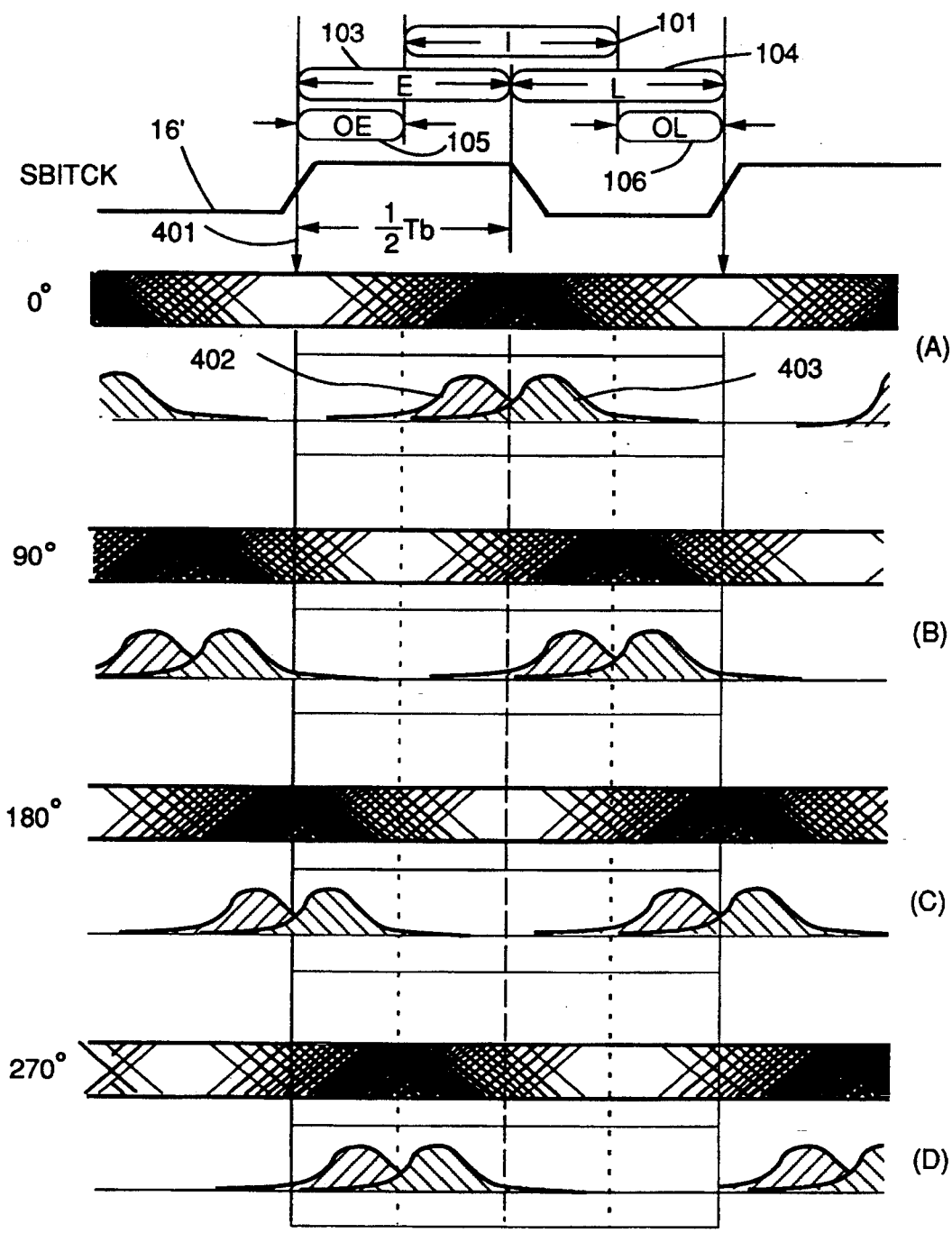
Figures 5A, 5B, 5C:
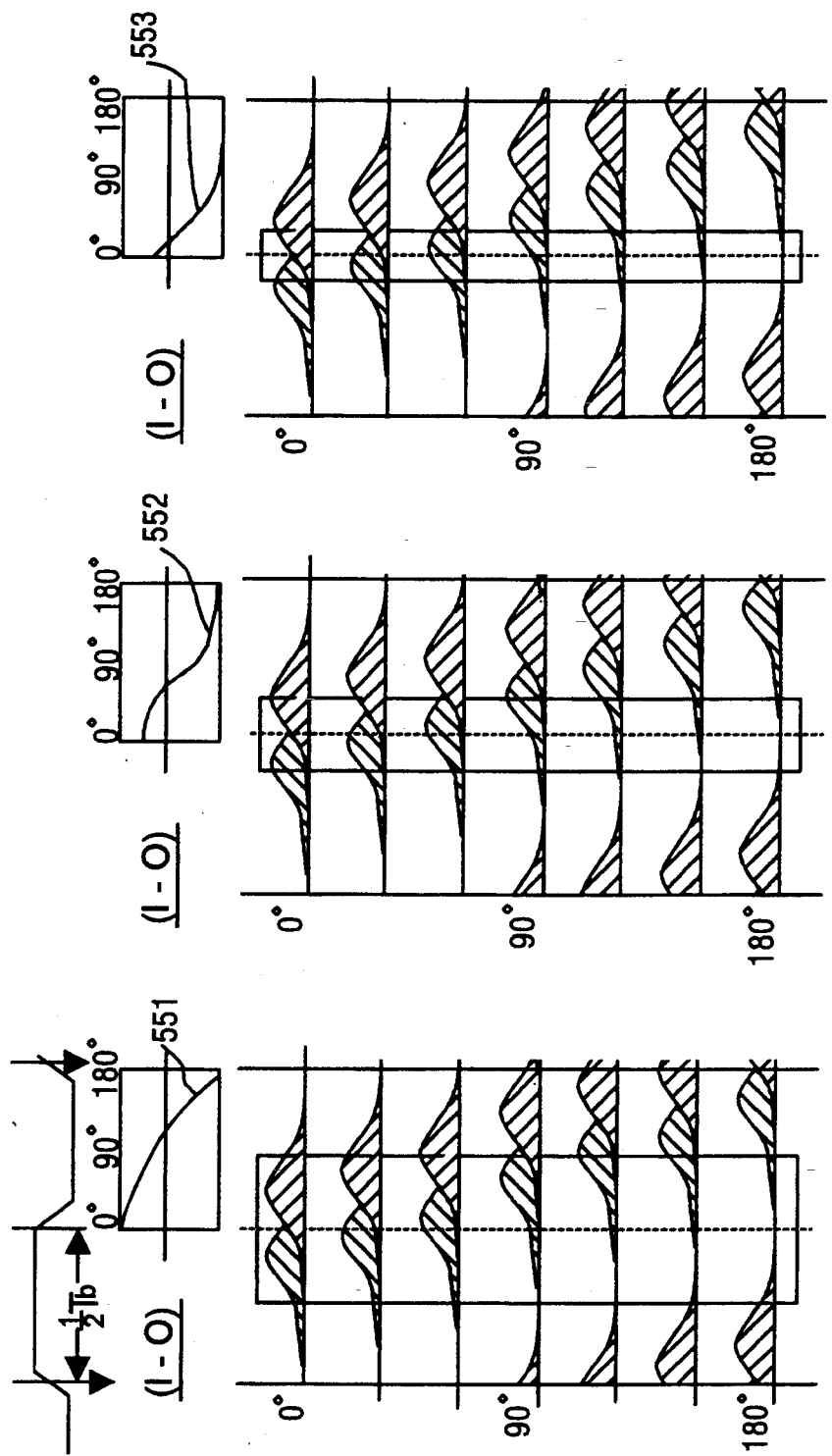
Figures 7A, 7B, 7C:
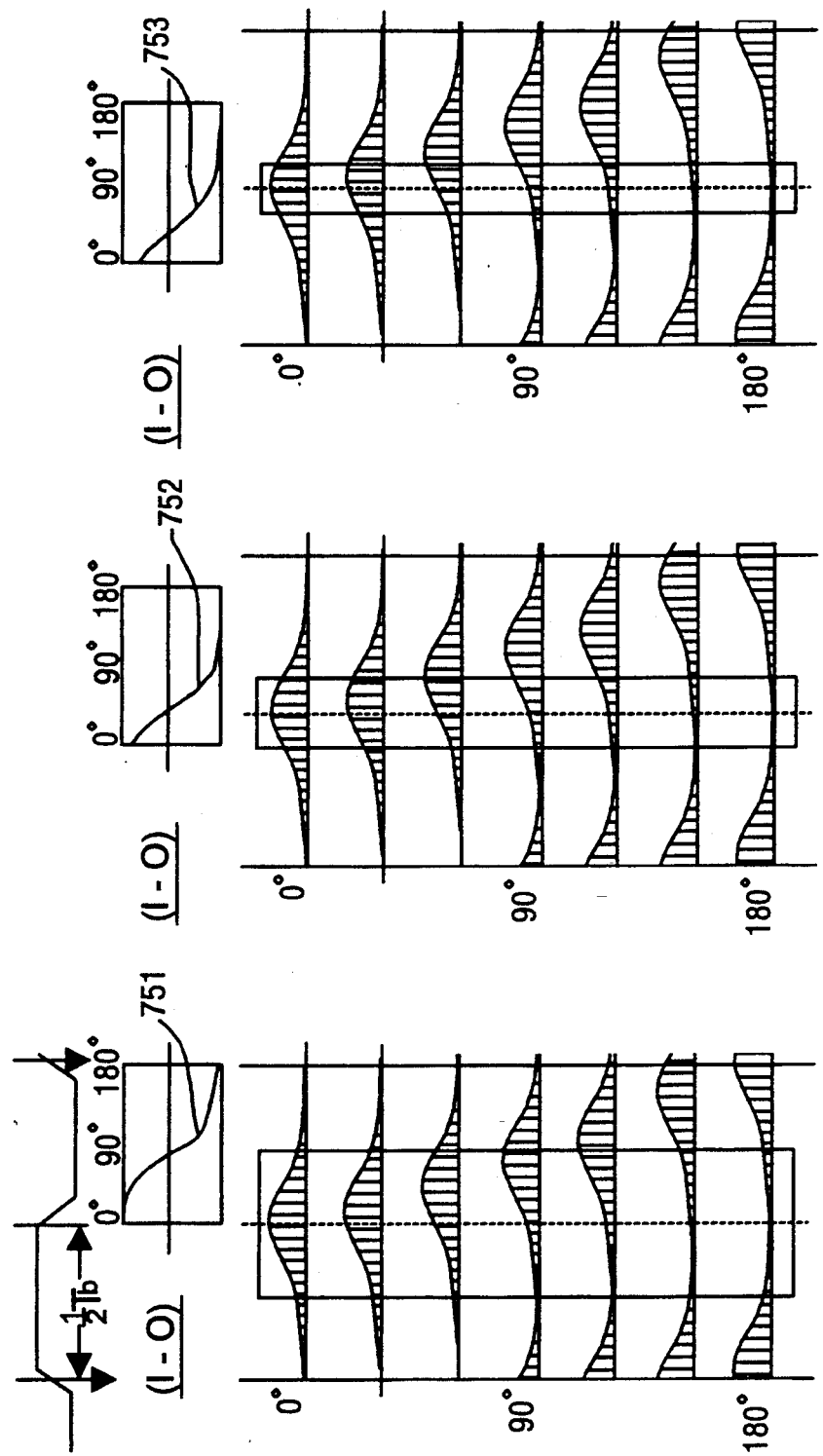

In FIG. 3, one embodiment of the edge distribution sampler block 81 from FIG. 1a and its connection to the phase adjustment decision block 82 and to the time ruler delay elements 22, 23 are shown. In this embodiment, SBITCK 16' is used as the clocking signal for the latches 810, which inputs are from nodes 25 through 29. Signal arrived at node 27 is half bit time later than that seen at node 25, and signal arrived at node 29 is half bit later than that seen at node 27. Node 27 is named W0 because data edge or transitions are expected to be captured around there if the SBITCK is aligned with the center of the data eye or they are "in look". Nodes 26 and 28 are taps from the delay element, the significance of their exact location will be subsequently discussed. For the purpose of explanation, I assume that these are taps in the middle of the delay element at this time. These five nodes make up several regions in respect to the sample clocking edge of SBITCK. Refer also to FIG. 4a for the regions:

The Inner Region (I)—region 101 where a data transition is captured when it is between the two middle nodes 26 and 28;

The Outer Early Region (OE)—region 105 where a data transition is captured when it is between node 25 and 26;

The Outer Late Region (OL)—region 106 where a data transition is captured when it is between 28 and 29;

The Outer Region (O)—the logical OR combination of OE and OL;

The Early Region (E)—region 103 where a data transition is captured when it is between node 25 and 27;

The Late Region (L)—the region where a data transition is captured when it is between node 27 and 29.

Exclusive OR (XOR) gates 815 are used to determine if a transition is captured in one of the regions. For example, if a transition is in the OE region while the SBITCK is sampling, the sampled binary level at output 805 and 806 would be different such that the XOR output OE 821 is a "1". If it is "in lock" or the sampling clock SBITCK is well aligned with the data eye, there should be only a single transition captured, so that 823 or 824 is "1" and all other XOR outputs are "0"s. A "1" in either 821 or 823 will make XE 825 a "1", meaning that the transition is captured in the "early" region. A "1" in either 822 or 824 will make XL 826 a "1", meaning that a transition is captured in the "late" region. Assuming a transition is captured in the early region so XE is a "1" while XL is a "0", the clocking edge of the signal ISBITCK 16″ is gated through by one of the AND gates 817, and the "early" counter 831 is incremented by one while the "late" counter 832 remains unchanged due to the fact that XL is a "0" preventing the clocking signal ISBITCK from incrementing the late counter 832. After a number of sampling cycles, the "early" counter 831 and the "late" counter 832 received the number of counts equals to the captured early and late transitions respectively. The test for finding and registering the differences of the two (called E-L test, meaning total early minus total late in a sampling period) are computed in up/down counter 841 and output to the phase adjust decision 82 via bus line 87. The same analysis applies to the "I" and "O" region for transitions captured in the "inner" and "outer" region respectively. The test for differences in captured transitions for the two (called I-O test) is computed in subtractor I-O 843 which holds the difference for transitions captured in Inner and Outer regions. The subtractor B-S 843 holds the differences for B (in both "early" and "late" region or in neither early or late) and S (only a single transition is captured). The test for the difference of the two is called B-S test and is also sent the decision 82 via bus line 85′. When transitions are captured in both "E" and "L" region or none are captured in both region, the outputs of XE 825 and XL 826 are at the same logic level, so XOR 829 output is a zero, otherwise it is a "1". Counters B (for both) and S (for single) will be incremented accordingly. The contents of the counters and subtractors are the edge distribution information needed for the phase adjust decision block 82 to make adjustment decisions.

FIGS. 5a, 5b, 5c through 8a, 8b and 8c are diagrams illustrating the edge distribution analysis for the phase adjust decision process. In FIG. 4a, the phase shifted integrated time ruler signal SBITCK 16′ is shown and the detection regions are defined as described early. Data waveforms are shown in overlapped eye diagram format together with histogram information for the edge distributions for rising edges (402) and falling edges (403) respectively are shown as an increased concentration of lines where the histogram has higher concentration. Row (A) FIGS. 4a & 4b illustrates the "in lock" situation (or 0 degree offset) when the rising edge of the SBITCK is aligned with the center of the data eye as indicated by line 401. Observations of the distribution in this case reveals with reference to FIG. 4b:

1. Almost all the transitions are captured within the "I", 101, region. A few edges in the tails 402′ of the distribution is within the "O" region. The I-O test result shown in column 111 should take position maximum value.

2. Equal transitions are captured in "E" and "L" region because of the symmetry and the alignment of the distribution. E-L test result shown in column 112 should be zero.

3. Only a single transition can be captured in each sampling, so B-S test in Column 113 should take the negative maximum value.

4. Rising edge distribution represented by the cross hatched curve region 402 is centered at the early ("E") region, so RE (rising early) is much greater than RL (rising late), while FE (falling) is much smaller than FL (falling late) since the falling edge distribution curve 403 is centered at the late ("L") region.

The same analysis technique is illustrated by the situation when SBITCK is 90 degree out of phase in row (B), 180 degree out of phase in row (C), and −90 (270) degree out of phase in row (D), each in respect to the center of the data eye. Note that if it is 180 degree out of phase, the result of the E-L test is the same as if it is aligned. Thus this test can not be used to distinguish between 0 degree or 180 degree out off phase. However, the I-O number is maximum with a change in sign, and will be a reliable test to distinguish the two. It also noted that the result of the I-O test in column 111 is the same for the event of 90 degree or −90 degree out of phase situations, thus can not be used to differentiate these two states. This information is needed to determine the direction in up/down type of phase adjustment. However, E-L test in column 112 has the maximum opposing number for these two, so the E-L test is obviously the test to extricate if the SBITCK is leading or lagging the data. From the above analysis, it can be seen that test E-L or test I-O are a function of the SBITCK phase offset, and the two functions are 90 degrees out of phase.

Figures 8A, 8B, 8C:
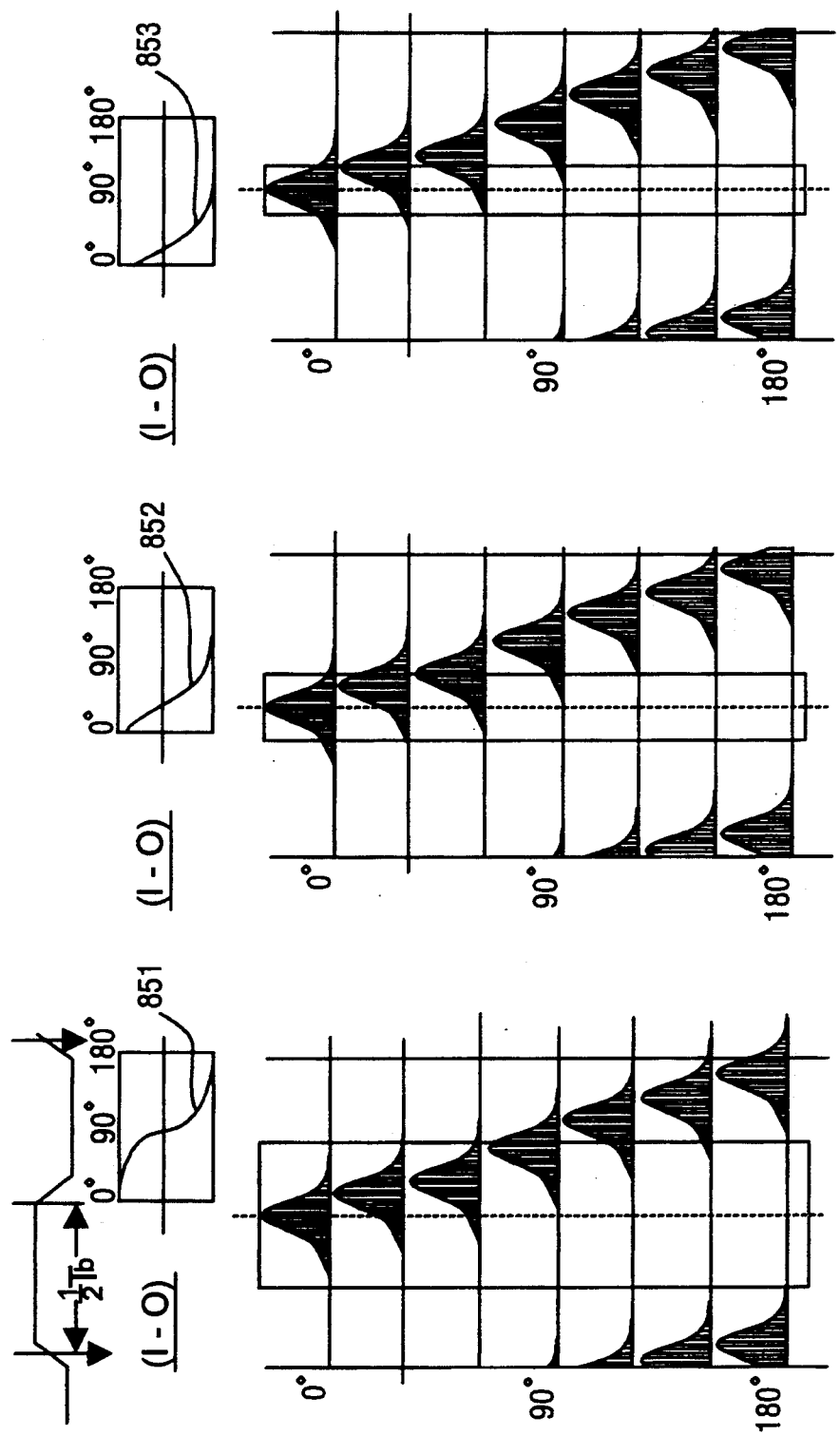

In FIGS. 5 through 9, variations in width of the "I" region as well as the peak-to-peak value of the captured data transition distributions are considered. FIGS. 5a, 5b and 5c illustrate the I-O test results when the width of the "I" region is large, medium and small respectively. The width of the "I" regions are shown in shaded areas. Since the I-O test is primarily for differentiating 0 degree offset and 180 degree offset, large "I" region width represented by I-O curve 551 in FIG. 5a has a greater slope near 180 degrees and is much more appropriate for the task than the small "I" region width represented by curve 553 in FIG. 5c. FIGS. 6a, 6b and 6c are for the same situations except that the total data edge distributions are depicted in standard Gaussian Distribution with a medium peak-to-peak value of about +−30% of the bit period. The same conclusion can be reached that large "I" region width should be used. FIGS. 7a through 7c show the situations when the peak-to-peak value of the total edge distribution is large and FIG. 8 shows the situation when the peak-to-peak value of the data edge distribution is small. Summarizing, for all cases, a large "I" region width will make the distinction between no offset and 180 degree offset easier. FIGS. 8a through 8c are for the situation when the peak-to-peak value of the edge distribution is small and the same conclusion can be reached. FIGS. 9a–9e summarizes the above discussion for different test and peak-to-peak value of the edge distributions.

FIGS. 9a–9e shows edge distributions for three different peak-to-peak values. Curve A, B and C are for edge distributions with small, medium and large peak-to-peak values respectively. In FIG. 9b, the result of the E-L test as a function of the SBITCK offset in respect to the mean of the data edge distribution is plotted for the above three cases respectively. This test E-L is also used to determine if the circuit is "in lock". An absolute threshold number d can be specified which is the maximum number allowed for the differences between the number of the "early" edges and the number of the "late" edges in a sampling period. If the difference is below d, then no adjustment needs to be performed. When the absolute value of E-L exceeds d, and "up" or "down" phase shifting of the integrated time ruler is enabled. The up/down shift direction depends on if E-L has positive or negative value. Note also in the figure that the phase alignment for pA, pB and pC are different for the same threshold value d because of different data transition distributions. Data edge distribution with smaller peak-to-peak value as curve A has less alignment error, pA. Digital filter functions may also be included to reject the effect from temporary phase change caused by noise. However, this is accomplished mainly by choosing optimized sampling size which will be discussed later. In FIG. 9c, the result of I-O test as a function of the phase offset is plotted for the three types of edge distributions. As mentioned before, when the absolute value of E-L is below threshold d, the phase relation of the SBITCK and the data is either close to 0 degree or in the neighborhood of 180 degree. The I-O test is primarily for differentiating the two, which is not a difficult task since the I-O test has opposite maximum value in those two events. FIG. 9d shows plots of the results from B-S test, assuming that data has transitions for every bit and there is dominant duty cycle distortion jitter associated with the data. The B-S test does not provide more information regarding the phase alignment than that provided by the I-O test. It may be used as a double-checking condition.

FIG. 10, shows the truth table for the various conditions and the corresponding decision control signals output of the Phase Adjust Decision block 82, FIG. 1a, are summarized. The E-L, I-O, and B-S tests have predetermined characteristics in each quadrature which can be used to make phase adjust decisions. This condition differs from the analog PLL-based systems, in which the phase error signal from a phase detector results immediately in a response in frequency adjustment of the VCO. Low pass filter for smoothing the error signal is necessary in such analog PLL loops to reject high frequency components in the phase error signal caused by noise, while retaining the low frequency phase variation information representing real frequency or phase drifting. In this digital approach, however, the edge averaging mechanism has inherently low pass filtering functionality, since phase adjust decision command is not generated based on phase error of an individual edge, but rather on an averaged edge position or the average of the phase errors for many bits. The decision logic for implementing functions in the table can be relatively simple. For example, if each digitally controlled adjustable phase shift step is very small (delay of a minimum delay unit), a pure combinatorial logic may just be enough to map the E-L, I-O test outputs condition as the inputs to phase adjust control outputs UPDNEN and UPDN. Since the amount of phase adjustment allowed for each step is small, regardless of the phase error magnitude detected, another type of low pass filtering is embedded in the scheme. Additional digital filter functions can also be implemented. For example, not only the values of the tests, but also the rate of the change of values can also be counted for making the adjust decision. Furthermore, variable value adjustment steps may also be used depending upon the magnitude of the phase error detected, and on the quadrant of the phase offset. A "FS" output signal (Fast/Slow mode switch) can also be generated: if the phase difference detected is more than +−90 degrees, or it falls into Q2 or Q3, larger phase adjustment step or multi steps in one adjustment may be used. This is useful during the initial lock-in period in which fast adjustment is often needed.

Figure 11:
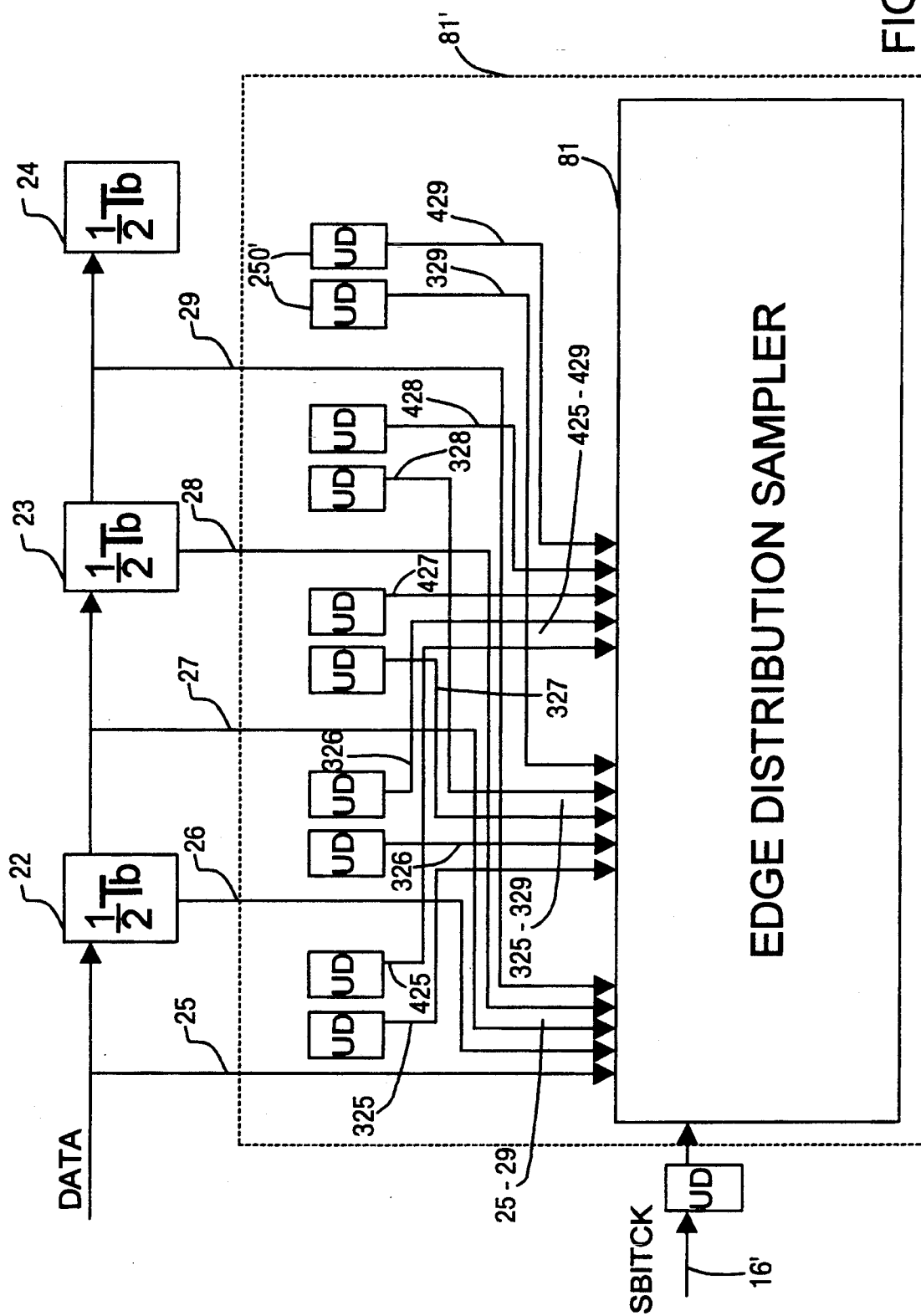
FIG. 11 is the block diagram of an embodiment of an alternative edge distribution sampler.

FIG. 11 is an alternative embodiment of the diagram for the edge distribution sampler which provides a different way to determine the "in lock" condition. Signals at nodes 25 through 29 are further delayed by two unit delays to provide two more sets of sampling points 325 through 329 and 425 through 429. The SBITCK 16' is also delayed by a unit delay, so sampling points 325 through 329 is the center group, sampling points 25 through 29 becomes the left group and sampling points 425 through 429 is the right sampling group. The edge distribution sampling takes place for all three groups and the phase adjustment process can be paused or the circuit considered to be "in lock" when the phase offset is detected near zero for the center group, positive (data is leading the SBITCK) for left group, and negative (data is lagging the SBITCK) for the right group.

Figure 12:
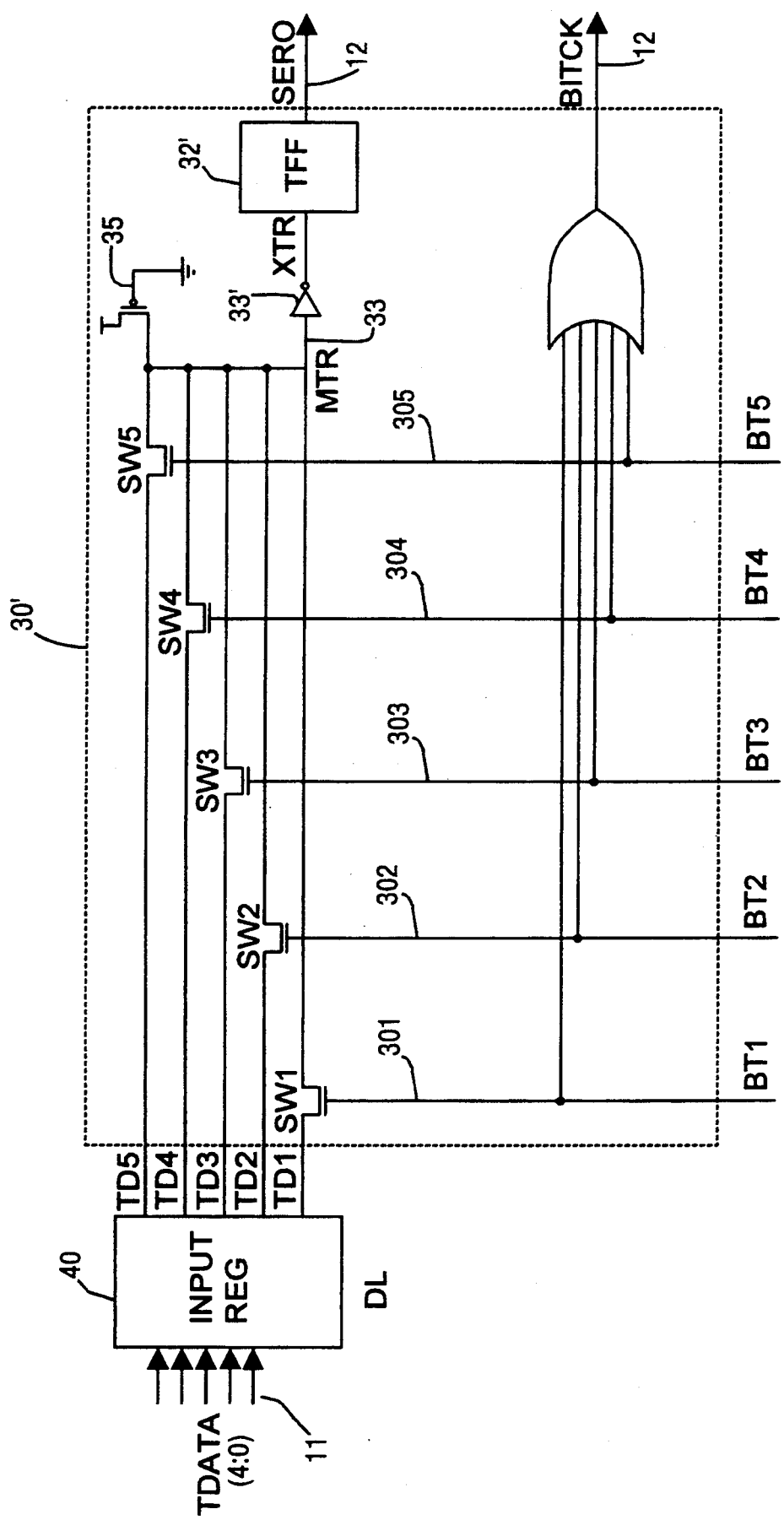

Bit Serializer (FIG. 12)

With reference to FIG. 12, the circuit for the bit serializer 30 of FIG. 22 is disclosed which serializes the parallel data input and which provides the "Compensated" clock called BITCK, Parallel data TDATA (4:0) are latched into the input register and are valid at TD1 through TD5 at the rising edge of DL before the rising edge of BT1. TD1 through TD5 are complements of TDATA (4:0). Node 33 at the input of invertor 33' is pulled high by a weak-drive device 35 if none of the MOS switch SW1–SW5 are on. When the pulse of BT1 arrives, it turns on MOS switch SW1 for the duration of ½ Tb. Since output TD1, to which SW1 is connected is low, MTR or node 33 is pulled low for ½ Tb. This causes T-FF 32' to produce an output transition of SERO at 12. A half bit later BT1 returns to low, turns SW1 off, causing XTR on node 34 to return to zero. This sequence is repeated as a gated readout of the register. If one of the bits in the input register is zero, no transition will occur at output SERO for that bit. This operation is more fully described in my earlier copending application, entitled "Digital Data Serializer and Time Delay Regulator", Ser. No. 07/901,312 filed Jun. 19, 1992, AMD Docket A865.

Figures 13A, 13B:
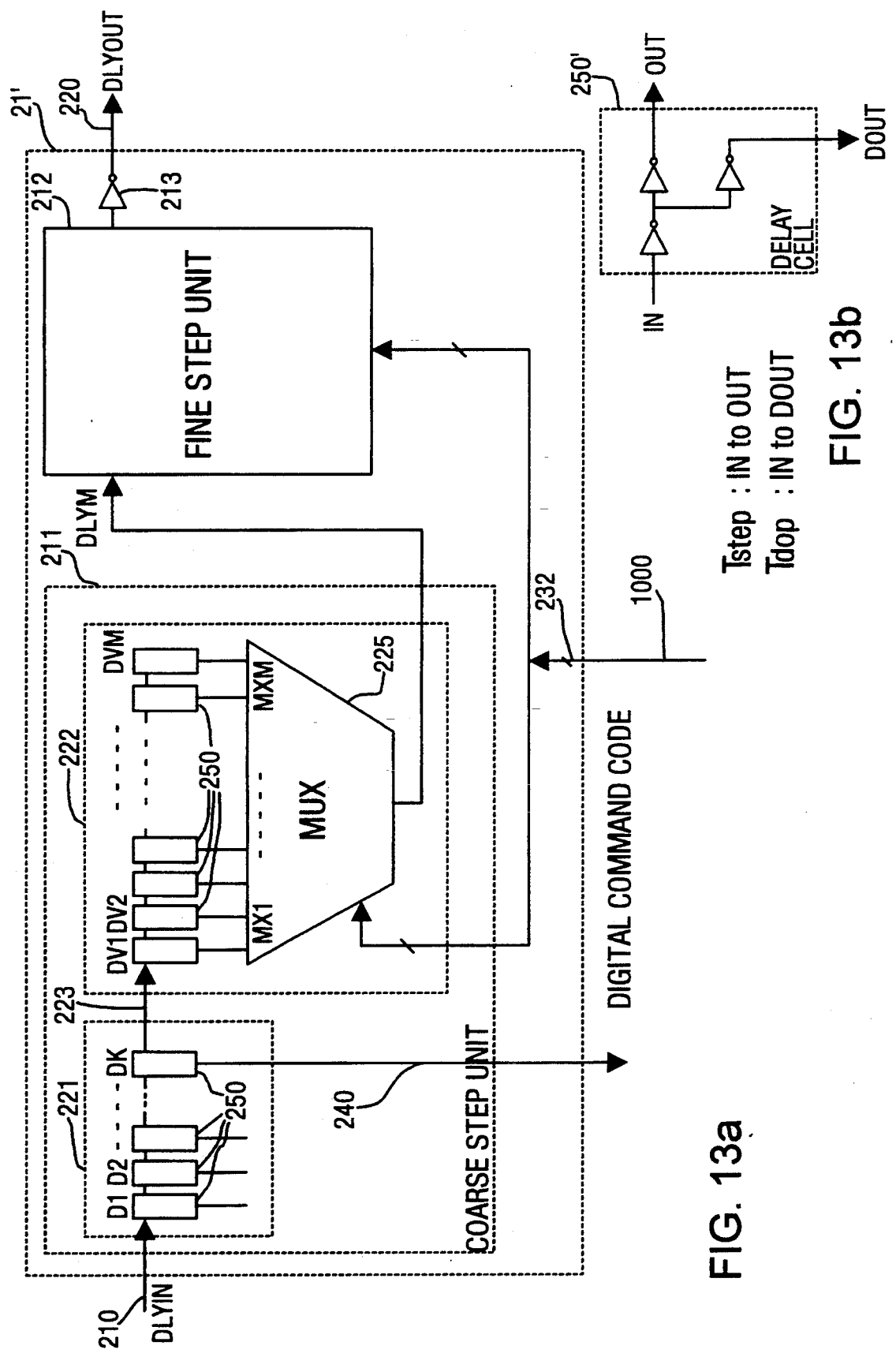

Delay Units (FIG. 13a)

The delay line 21 of FIG. 2a which provides the time ruler signals BT1–BT5 is made up of a plurality of cascaded adjustable delay units 21' each of which nominally provide a delay of ½ Tb. FIG. 13a shows that the adjustable delay unit 21' is preferable made up of two parts: a course step unit 211 and a fine step unit 212. The course step unit 211 is formed by two parts: a fixed-stage delay 221 and a variable-stage delay 222. There are k stages of delay cell 250 (d1 through dk) in the fixed-stage delay 221 and m stages of delay cell 250 for the variable-stage delay 222. One of the embodiments of delay cell 250 is shown in FIG. 13b, which employs 3 invertors. The delay from IN to OUT is defined as $T_{step}$, while the delay from IN to DOUT is defined $T_{dop}$. The delay from the input of the delay cell DV1 (223) to the MUX 225 output DLYM of the variable-stage delay 222 depends on the digital command code on line 232, which selects only one path of MUX 235 from MXI through MXM to DLYM. Assuming that delays in MUX 225 from MX 1 through MXM to the output of the MUX 225 are all the same ($T_{mux}$), and the digital command code selects the path of MXI to DLYM, or if i delay stages are selected in the variable stage delay 222, the total delay of the course step unit 211 can then be obtained:

$$T_{coarse} = K(T_{step}) + T_{dop} + T_{mux} + i(T_{step})$$
$$= T_{int} + i(T_{step})$$
$$(i = 1, m)$$

where $T_{int}$ is the "fixed" part of the delay unit, or its intrinsic delay. The value of parameter k and m are chosen to guarantee that under all processing and operating conditions that the unit delay element adjustable range is large enough to be able to produce the nominal delay required (½ Tb). $T_{step}$, the delay of the delay cell 250, is the base delay or the minimum adjustable delay of the operation which determines the resolution of the operation. $T_{int}$, is the intrinsic delay of the delay unit which will determine the up-limit of the operating frequency. The delay unit 21 could be built by just using the "course" step unit itself if both $T_{step}$ and $T_{int}$ are satisfactory for the frequency targeted. The addition of a fine step unit 212 can be beneficial for both higher frequency operation and for lower frequency or larger frequency range operation. For the former, a even finer adjustment than $T_{step}$ is achieved in the fine step unit 212 to improve the resolution to reduce the timing error. For the later case, $T_{step}$ can be chosen a larger value (10× for example). Fine step unit 212 can use exactly the same structure as the course step unit 211 with its base delay cell delay being a finer value (one 10th of $T_{step}$ for example), or it can be built with a different structure. In any case, it is the digital command code on bus 232 that also controls the delay of the fine step delay unit 212. Assume for this example that a coarse step adjustment is applied to each delay element. If a total of 10 (2N=2×5=10) coarse step adjustments are applied to the delay unit at the same time, a total delay range adjustment of 10×$T_{step}$ will result for the whole delay line. Another requirement for the delay units is a matched signal rise-to-rise and fall-to-fall delay to ensure a non-distorted pulse width while a pulse is traveling through the delay line. Inverter 213 is used for inverting the polarity of the signal from DLYIN 210 to DLYOUT 220, so for every other delay unit (or a bit time delay) the signal is not inverted and that any mismatches in the rise and fall delays inside the delay unit will be canceled.

With reference to FIG. 2a, the digital command from the Up/Down Shifter 90' on line 1000 controls each of the delay units 21 and 21' such that the delay of each equals to half of the bit period (½ Tb), accurate to ±one step in the delay unit, provided that all the delay units are identical and that proper codes are chosen at any particular instance.

Figure 14A:
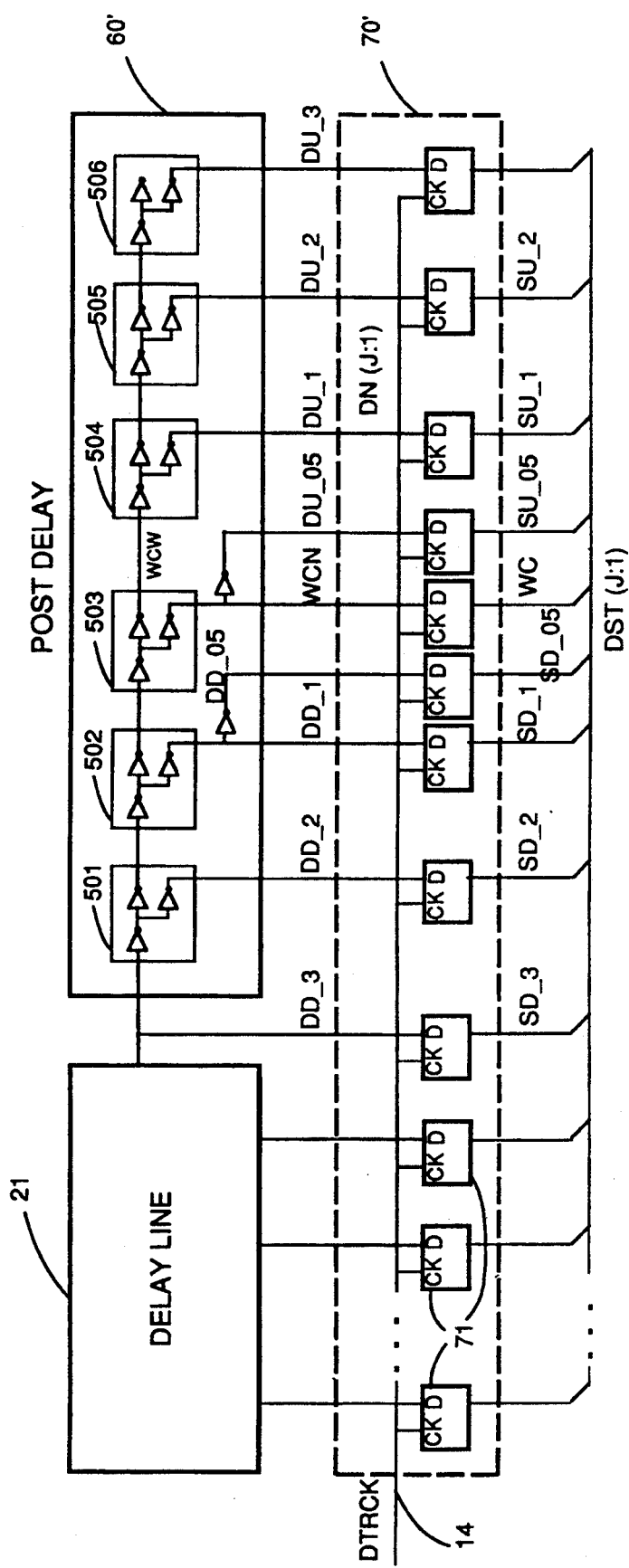

With reference to FIG. 2a and FIG. 14a the delay line 21 detection is performed by "sampling" the level status of the delay units by a registration process which looks at each monitored node of delay units from BT3 through delay units 501 through 506 of phase detector and of post delay 60'. The monitored node is chosen in such a way that the time delay between any two consecutive nodes in any operative condition should be less than ½ Tb. Sampling Registers 70' samples the levels of each monitored node at the rising edge of the LCLK to locate the position of the previous DTRCK rising edge. Alternatively, the task of locating the position of the previous rising edge could also be accomplished by sequentially setting corresponding RS Flip-Flops which are connected to each of the monitored nodes upon the arrival of the pulse at each monitored node. At the occurrence of the DTRCK rising edge, the RS Flip-Flop status can be interrogated to determine the position of the previous rising edge by locating the border between the set and non-set RS Flip-Flops.

With respect to the embodiment of FIG. 14a, if the delay of the delay units is very close to the nominal value of ½ Tb, when a rising edge of DTRCK arrives at input to Delay Compensation 52' FIG. 2(a), the previous DTRCK rising edge should be somewhere around or near the nodes at the interface of delay line 21 and phase detection delay 60', having been delayed the full byte clock period or the delay amount of 2N delay units by the delay line 21. A level change indicating a rising edge position is observed in this region when the levels of the monitored nodes are latched into the D type Flip-Flop registers clocked by DTRCK. This region is where the timing or phase difference between the sampling clock DTRCK on line 14 and the various delayed copies of the sampling clock DN(j:1) needs a close examination, and it is called the detection window. Assuming the command code to the Delay units is set correctly such that the delay of the delay units are exactly ½ Tb, we define node WCN, FIG. 14a and FIG. 14c on the output of delay 503 in the phase detection delay 60 to be the "window center node" where the transition is to occur if the delays are correct when sampling takes place. If the delay of the delay units 21 is not exactly ½ Tb, then the transition will be detected on either the left side (indicating "early") or on the right side (indicating "late") of the window center.

The same type of delay cells used in delay unit 21 is also used in the phase detection delay 60' (501 through 506).

We group the inputs to the sampling register 70' from different nodes of the delay line 21, from Phase Detection Delay and Post Delay 60' in a bus signal and call it DN(j:1). The outputs from the sampling register 70' are the sampled level status for the above nodes and are called DST(j:1). We can show that a "... 111 .. 111000 ..." type of this status code can be expected near the node where a "0→1" transition is taking place when it is sampling. A "... 001110000 ..." type of status code is seen if the signal pulse width is relatively narrow in respect to the delay amount of the delay line. Note that if the time delay interval between any two adjacent nodes is smaller than the pulse width in any operation conditions, the pulse will be "buried" between the two nodes and the transitions of the pulse will not be seen. The resulting status code in this case will be "... 00000 ...". Assuming that the command codes are proper, the WCN is the node around which a level change or transition occurs when the sampling register 70' latches the level status into the DFF's. In the event that temperature change or supply power noise causes delay variations so that the delay of the delay units 21 is no longer equal to half of the bit period, or the total delay of delay line 21 is no longer equal to the byte period, the transition detected will be on one side of the WCN, giving indications whether the delay of the delay unit 21' is shorter or longer than the nominal value.

Figure 14B:
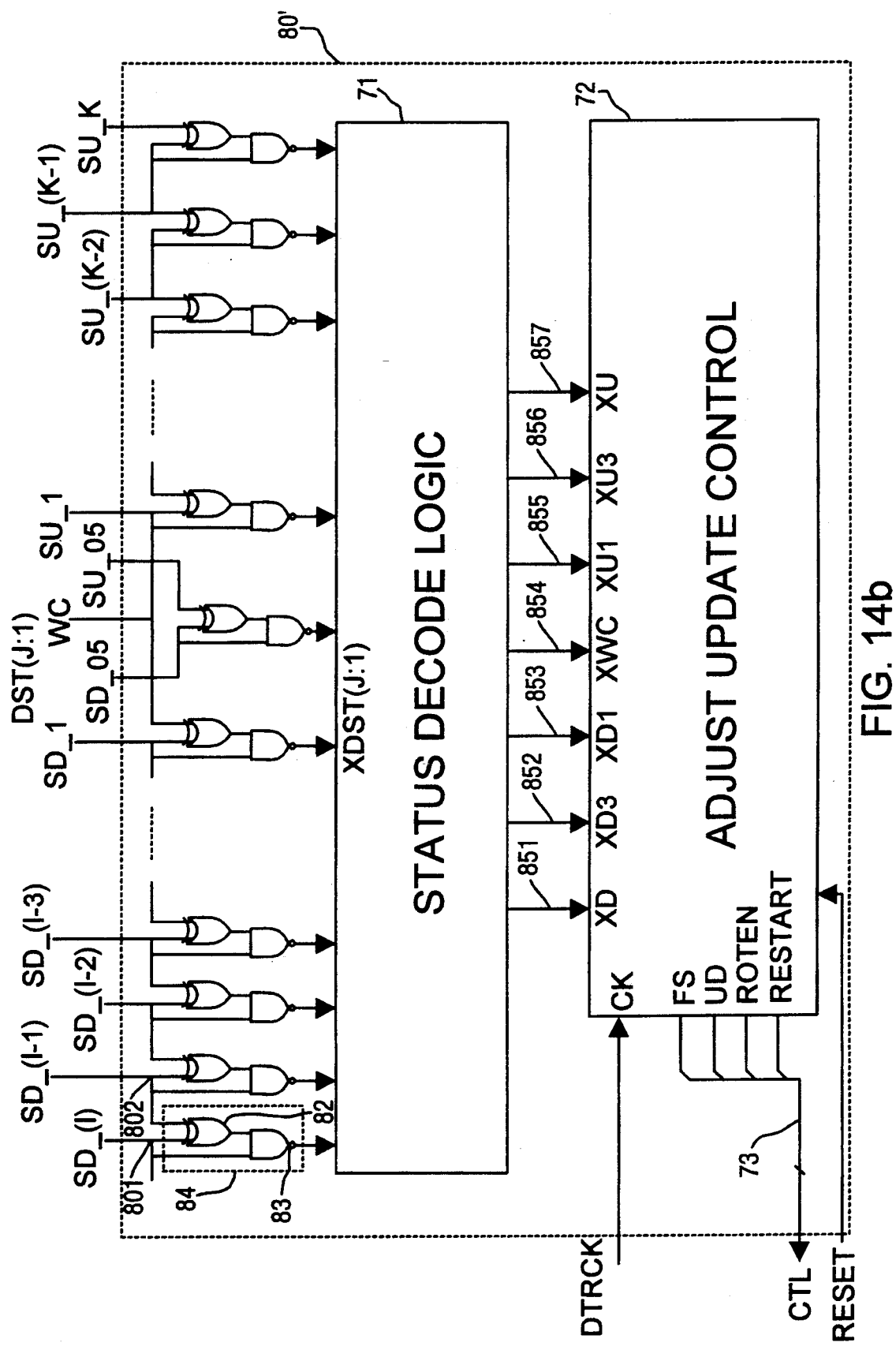
Figures 14C, 14D:
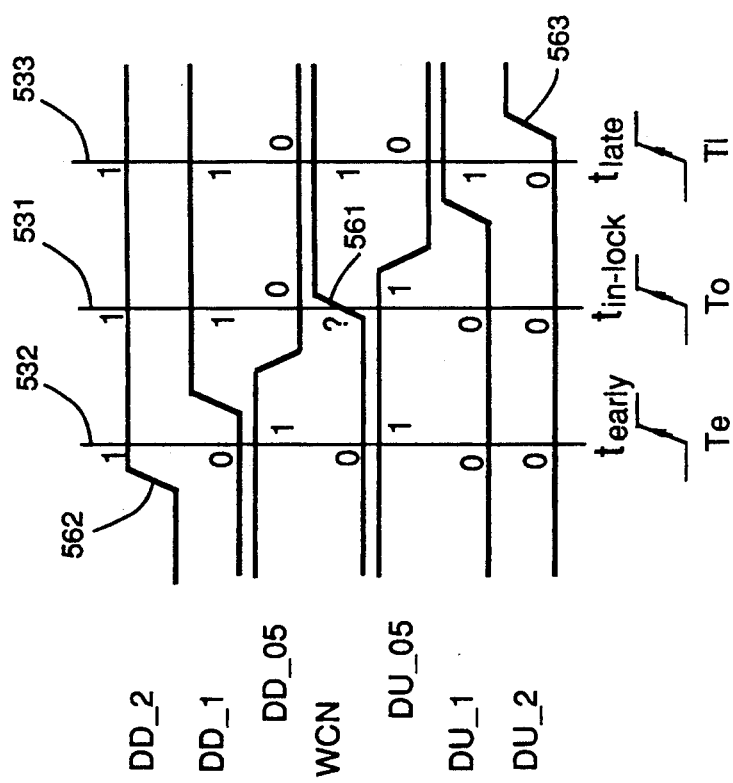

FIG. 14c shows the waveforms at the input of the sampling register 70' FIG. 14a, and the status is sampled for different timing conditions. Line 531 shows the status when the delay units are "calibrated" to their nominal value or the delay line is "in-lock." Line 532 shows the status when the sampling clock DTRCK is "early," which is equivalent to when the delay of the delay units is larger than their nominal value such that the previous rising transition or the delayed copy 561 has not arrived at WCN. Line 533 is for the case the sampling clock is "late" so that the transition 561 has passed WCN. The sampled status codes are shown in the matrix of FIG. 14d. In the "in-lock" condition column, the transition or level status change occurs within $-0.5$ and $+0.5$ of WC delay unit range (552). In the "early" condition column, the transition occurred between node DD_2 and DD_1 (indicated by a level difference between SD_2 and SD_1, 533) when the sampling clock is sampling. This indicates that the delay of the delay unit is larger than the nominal value and that the control should decrease the delay of the delay unit. In the "late" condition column, the transition occurred between node DU_1 and DU_2, indicated by a level change 553 between SU_1 and SU_2 when it is sampled. This condition should cause the control to step up to increase the delay value of the delay unit to move the transition back toward the WCN. If the delay of the delay units is very close to its nominal value of ½ Tb, there is a strong probability that signal at WCN will be making a transition when DTRCK is sampling, 561, FIG. 14c, causing the flip-flop to enter the metastable state. However, since the outputs from the flip-flops DST(j:1) are sampled once every byte, it can allow several bit period times for metastable flip-flop resolution, adequate for the output to be settled at one of the two logic states. The addition of the phase detection delay 60' to the delay line 20 is to provide a more detailed look at the window center position. The additional delay caused by delay units 501 through 503, as well as the setup time of the D flip-flops in sampling register 70, is to be compensated by the delay compensation block 52'.

The calibration of the delay unit, in operation, includes two modes, the initial "power-up" mode and the normal operation mode. These modes are more fully described in copending application. "Digital Serialization Time Delay Regulator" docket A865, Ser. No. 07/901,312 filed Jun. 19, 1992.

FIG. 14b is the block diagram of one embodiment of the Ruler Adjust Decision Circuit 80' (FIG. 2a). The inputs to this circuit is the status code outputs from the sampling register DST(j:1) which are provided by the sampling process once every byte cycle. Complex gate 84 performs the function of rising transition detection. Only if the two inputs to the XOR gate 82 are in different logic levels and the one on the left is a logical one, then the output of the AND gate 83 will be high, indicating a "0→1" transition or a rising edge transition detected between the two consecutive nodes 801 and 802. There should be only a single "1" in the XDST (j:1) input bus lines for any sampled code since there is only a single rising edge in the delay line 21 per sampling cycle, if the delay units are calibrated to or close to nominal value of ½ Tb such that the whole delay line 21 delays a time equal to the byte period. If more than one "1" exists in XDST(j:1), a "noise" condition, or a "locked-on2×" condition (meaning that the delay value of the delay units are close to Tb instead of ½ Tb) is indicated. The Status Decode Logic 85' decodes the status code XDST(j:1) into a 7-line detection code on line 851 through 857.

Figures 15A, 15B:
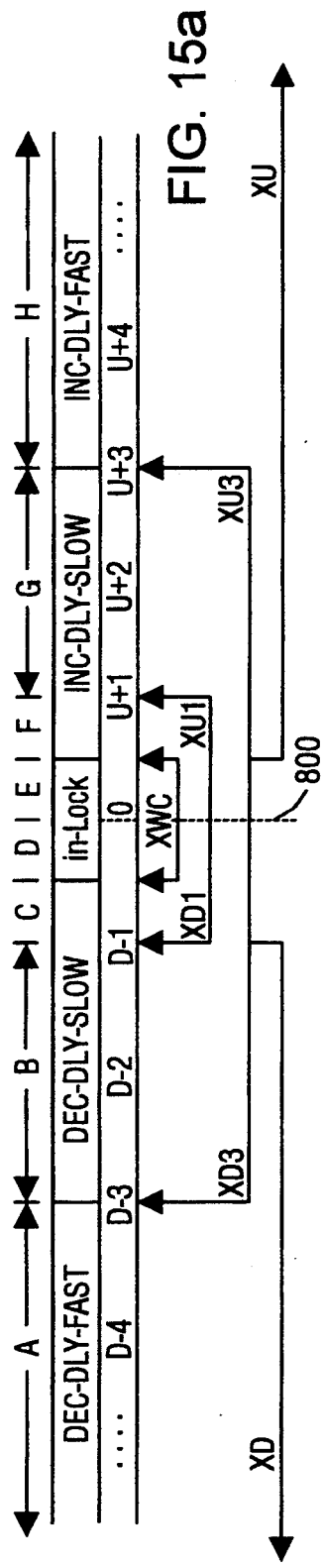
FIG. 15a is the time zoning analysis of the Adjust Update Control of FIG. 14b.
FIG. 15b is the logic truth table for Adjust Update Control of FIG. 14b.

FIGS. 15a and 15b illustrates the function of the Status Decode Logic 71. Line 800, FIG. 15a indicates the "window center" position. If the detected transition is within the region of $-0.5$ and $+0.5$ delay cell from the window center or in the zone D, E, XWC is "1". If the detected transition is in the region of one delay cell on left (right) side of the window center, then XD1 (XU1) is logic "1". If the detected transition is within three delay cells on left (right) of the window center, XD3 (XU3) becomes logic "1". If the transition is in the region one delay cells away on left side of the window center XD (XU) is a logic "1". Note the overlaps of the regions. The status of this detection code combination gives the information as where the transition is detected and how fast this detected transition is moving from byte cycle to cycle. Both are useful when implementing a digital filter function. The Adjust Update Control block 72, FIG. 14b, is not a pure traditional combinatorial logic circuit, because the output of this circuit is dependent on the current input code combination, and on the history of the input/output. Also, in high speed data communications, the byte clock rate is in the range of ten's of MHz. As a result, the status sampling rate is much higher than the delay variation rate caused by normal temperature drift or supply voltage variation. It is necessary to "filter" out the digital "noise" in the status codes, and to ignore the temporary delay changes caused by high frequency power supply noise. Different digital structures can be used to implement the filter function. Generally, the filter function should remove or ignore rapid phase variations caused by rapid electrical noise, while passing the slow and steady phase changes caused by slow delay changes to the controls of the Up/down Shifter 90 to make proper command code adjustment to maintain constant delays of the delay units.

FIG. 15b shows a function table for implementing the Adjust Update Control 72, FIG. 14b. Columns 901 through 907 are the status code inputs from the Status Decode Logic which is sampled for every byte clock. Columns 908 through 910 are three intermediate variables. Outputs are shown in column 911 through 914 where UD and ROTEN are the control outputs to the Up/down Shifter for delay adjustment. ROTEN=1 enables the adjustment when control update is necessary. UD gives direction indication as how to make adjustment (UD=1 for step up and UD=0 for step down) to increment or decrement the delay of the delay unit. FS is the switching control between Fast adjust mode and Slow adjust mode. RESTART=1 enables a reset process in the event of a consistently detected error status.

With reference to 15b, row (a) shows the situation when the detected transition is in zone H, FIG. 15a right of XU3, as in the case of power-up. This is the zone for INC-DLY-FAST mode (UD=1 and FS=1), meaning delay of the delay unit needs to be incremented with large (coarse) step to be increased fast. This fast mode corresponds to a smaller loop time constant as in the PLL case. In row (b) and (c), the detected transition is still on the right side of the window center, so incrementing the delay unit is still necessary. However, assuming the transition is already within +−3 delay units, or +−3×$T_{step}$ from the window center, in zone G in FIG. 15b, no fast adjustment is to be made in this instance since each such adjustment of a delay change of 5×Tstep is too large and may "overshoot" to zone A on other side. This is the zone for INC-DLY-SLOW mode (UD=1 and FS=0), meaning delay unit incrementing is made with fine steps which correspond to a large loop time constant as in the PLL case. Row (d) and (e) indicates the IN-LOCK condition, which means that the total delay of the delay line is within +−0.5 $T_{step}$ comparing with the reference byte clock. No adjustment is necessary for this condition (ROTEN=0). Rows (f), (g) and (h) indicate similar situations as in rows (a), (b) and (c) except that the delay of the delay unit needs to be decremented (UD=0) instead. FIG. 15a provides a means to understand the overall operation of the adjust update control 72 relative to different zones in which the transition is detected. Row (i) and (j) shows error status in which either transitions are detected on both sides of the window center, or none is detected. These error status could be the result of digital noise in the status sampling process, and should therefore be ignored. The RESTART becomes active only if the errors are persistently detected. Another error status could result if the adjustable range of the delay unit is large enough that it delays time interval of Tb instead of ½ Tb. A IN-LOCK condition could be erroneously resulted since one transition should be detected in the middle of the delay line 20, while a second transition can be detected around the window center. This is indicated in row (k) of FIG. 15b as a LOCKED-ON-2× condition, similar to the case in PLL when the PLL is locked on the second harmonics of the reference clock. One solution to this problem is to restart the delay calibration process by setting the control code to the delay units in such a way that all the delay units select minimum delay value as the initial setting. In doing this, the transition is first detected on the right side of the window center to avoid the LOCKED-ON-2× condition. Note the "*" in the table in FIG. 15b, which means the controls become activated only if a certain condition is satisfied. For example, if the last value for UD is "0" (meaning delay decrement) while the current status code changes to XDN=0 and XUP=1 (meaning delay increment), one option is to change UD immediately to "1" if it is in the slow or fine adjustment mode, since only a small step adjustment can be made regardless of how big the delay adjustment is indicated by the detection, just like a fast spike on the phase detector output is "smoothed" by a large capacitor in the low pass filter. On the other hand, if it is in fast adjustment mode while a sudden change in direction is indicated, further detection results may be needed before a reverse direction adjustment is made. In any case, these type of digital filter functions can be implemented to make correct delay adjustment with less timing error or resulting jitter.

Digital Phase Shifter (FIG. 1a, FIGS. 16-21)

The digital phase shifter of my invention, as indicated above, must act as if it were an infinitely long delay line to accommodate the fact that there may be a slight and constant difference between the frequency of the local clock of the receiver and frequency of the transmitter.

The phase shifter utilizes a tapped delay line and a MUX to form a digitally adjustable delay to provide phase shifted copies of an input signal. An up/down control signal controls the increment or decrement selection of the delay so that a positively or negatively phase-shifted copy of the input signal is selected each time the selection is enabled. The digitally adjustable delay is able to provide phase shifting in 360 degree range in all operating conditions. An on-the-fly Phase Shift Range Calibrator detects the delay variation due to temperature or power supply variation and determines the output tap known as the End Stage Position (ESP) in the digitally controlled delay from which the input signal is delayed exactly 360 degree. In the event that the up/down control indicates that a constant positive (up) phase shift is needed, the Rotating Phase Shift Control moves the delay path selection one tap up every enabled clock until the ESP is reached. If a further up-shift is still indicated, the phase shift control will "wrap around" to select the 1st tap as the delay path such that a positive phase shift step is made in relative to the last selection where the control selects the tap output stage indicated by the phase range calibrator as the ESP. The same operation is performed when the up/down control indicates that a negative (down) phase shift is needed. The rotating phase shifting requires only an up/down and an enable signal from the phase detection and adjust decision logic. The digitally controlled or selected delay is adjusted one step at a time and, by virtue of its construction, is designed to be able to "freeze", or hold, a position in case there is no data to compare. The previous phase adjustments are also able to be "memorized" by the control logic which is used to send the up/down control signal, such that certain adjustment "patterns" or some modulating frequencies from noise sources may be recognized and filtered by the control logic.

Figure 1B:
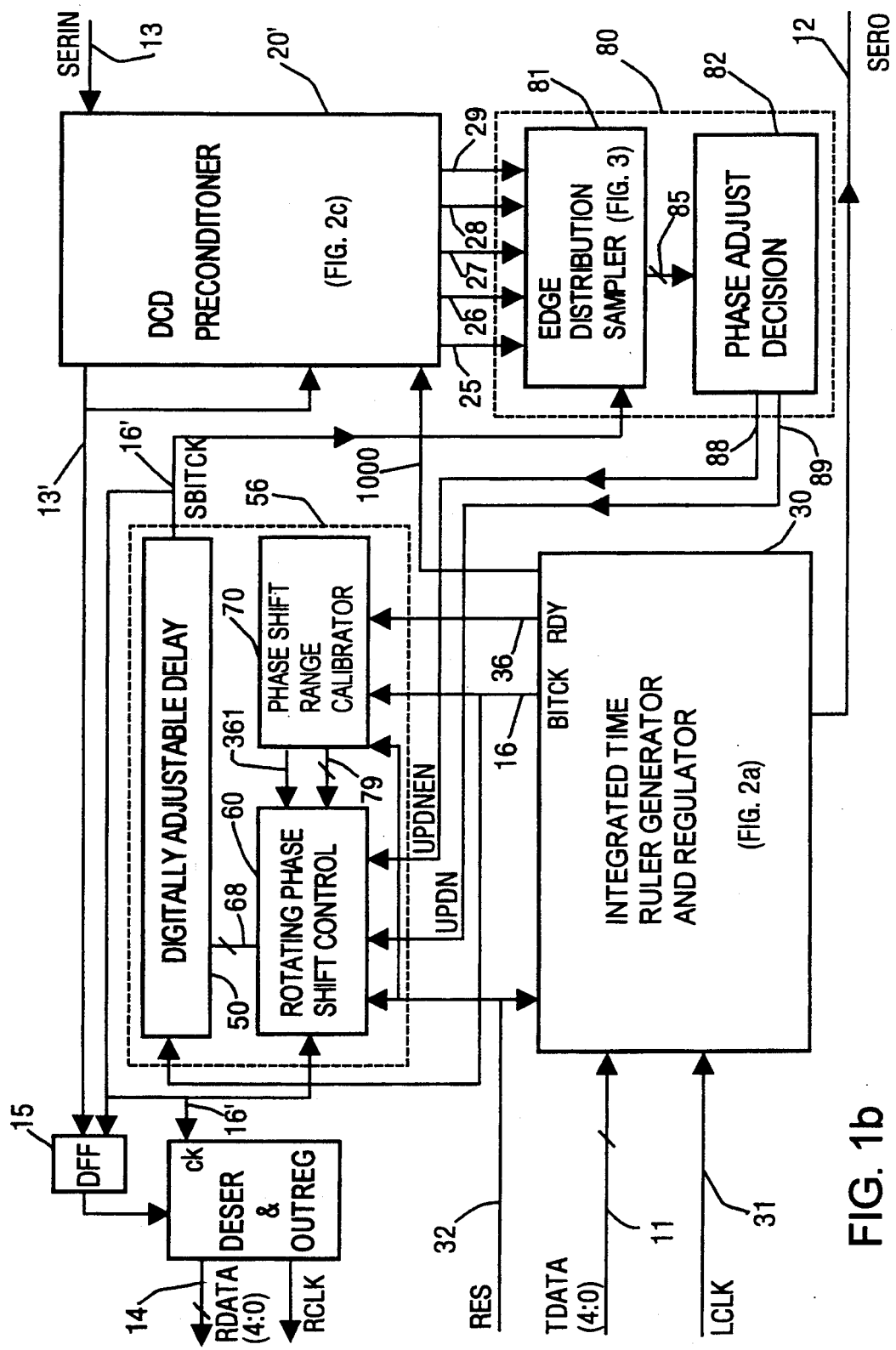
FIG. 1b is the block diagram of an alternative embodiment of the system of FIG. 1a, which employs a preconditioning block.

With reference to FIG. 1b the digitally adjustable delay 50 receives BITCK 16 and performs phase-shifting on it, providing the output from SBITCK 16, which is the phase-shifted copy of the original signal BITCK 16, as shown also in FIG. 2b. Waveform SBITCK 16′ is a phase shifted copy of waveform 16 by any desired amount. The phase shift is controlled by the parallel digital control code 68 from the Rotating Phase Shift Control 60. Rotating Phase Shift Control 60 only requires a signal UPDN 89 and UPDNEN (up/down enable) 88 from the circuit which informs this circuit to provide positively increasing phase shift (UP) or less or negatively increase phase shift (DOWN) form the current phase shift amount. UPDN 89 is "1" when further positive phase shift is needed, and is "0" when negative or less phase shift is desired. UPDNEN 88 is the adjustment enabling signal. UPDNEN is a "1" if the adjustment needs to be performed upon the arrival of the clock rising edge, and is a "0" if current phase shift is to be maintained frozen. Phase Shift Range Calibrator 70, FIG. 18, constantly monitors on-the-fly the delay change due to variations in operating conditions, and sends a parallel digital code 79 to the rotating phase shift control 60 to notify the position of the stage in the delay line where the original signal is delayed a full cycle or 360 degrees. RDY 36 are the signals from other circuitry to signify that the calibration is ready to be performed. RES 32 is the reset signal for resetting the controls during the power-up sequence or in other occasions when a re-start is necessary. IRG 361 is the In-Range signal when the phase comparator 73 finds signal PH0 711 and PHK 712 are almost phase aligned, FIG. 18a.

Figure 16:
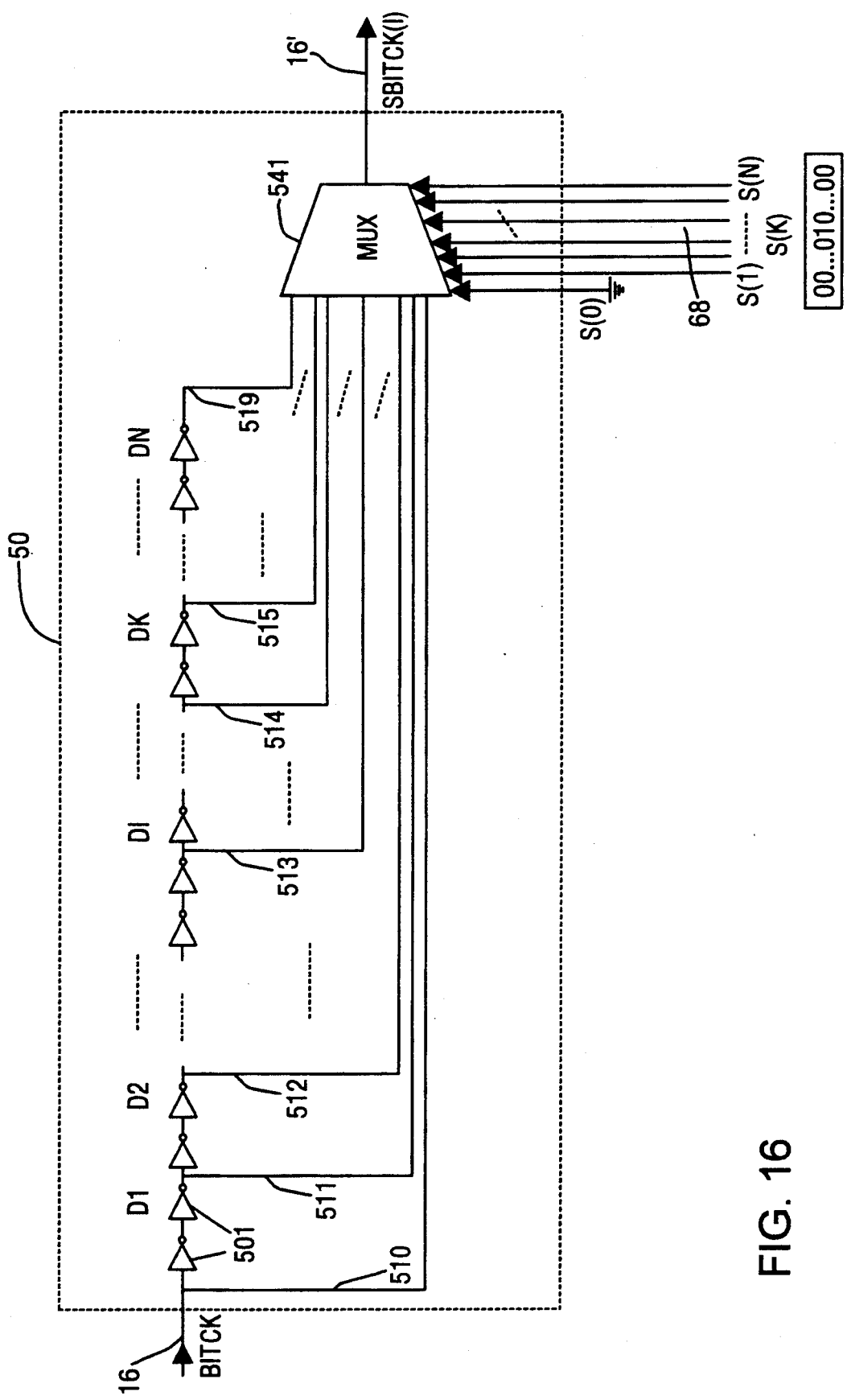
FIG. 16 is a block diagram of the Digitally Adjustable Delay.

FIG. 16 shows one embodiment of the Digitally Adjusted Delay which consists of a series of cascaded inverters 509 and MUX 541 or other fast path selector. The input to the MUX are the taps from the delay chain for every other inverters via lines 511, 512, etc. for a total of N pairs of inverters. The control inputs to the MUX, S(1) through S(N) 68, are outputs from the Rotating Phase Shift Control 60, FIG. 19 and FIG. 1a which are all "0's" except one "1" which selects a corresponding delay path. The control inputs S(0), which would select input on line 510 if it is a "1", is tied to "0" to disable the selection. If stage DK, FIG. 16, is the ESP, i.e., is found to be the stage at which signal BITCK is delayed or phase shifted a full 360 degrees, the delayed signal at the output of the stage DK on line 515 should be coincided with that at the input on line 16. This can be better seen in FIG. 17, the timing diagram of the delay, where the output signal SBITCK(K) of 515 is coincident with signal BITCK 16 on line 16. A next positive phase shift step can be achieved if the selection moves to stage 1, shown as SBITCK(1) 511, where a phase shift 411 equal to the delay of two inverters is shown. It is seen that an endless positive phase shift can be achieved if the digital control 68, FIG. 16 steps through from S(1) to S(k) then rotates or "wraps around" to S(1) and so on, where S(K) corresponds to the 360 degree phase shift end stage or the ESP. In an integrated circuit format, the delay of the inverters, in the Digitally Adjustable Delay 50 varies with process, environment and power supply. For a given cycle time or 360 degree phase shift, K could be a different number due to above factors. To acquire accurate 360 degree phase shift rotation, the delay of the inverters have to be constantly detected so an accurate ESP location can be maintained for calibration.

Figure 18A:
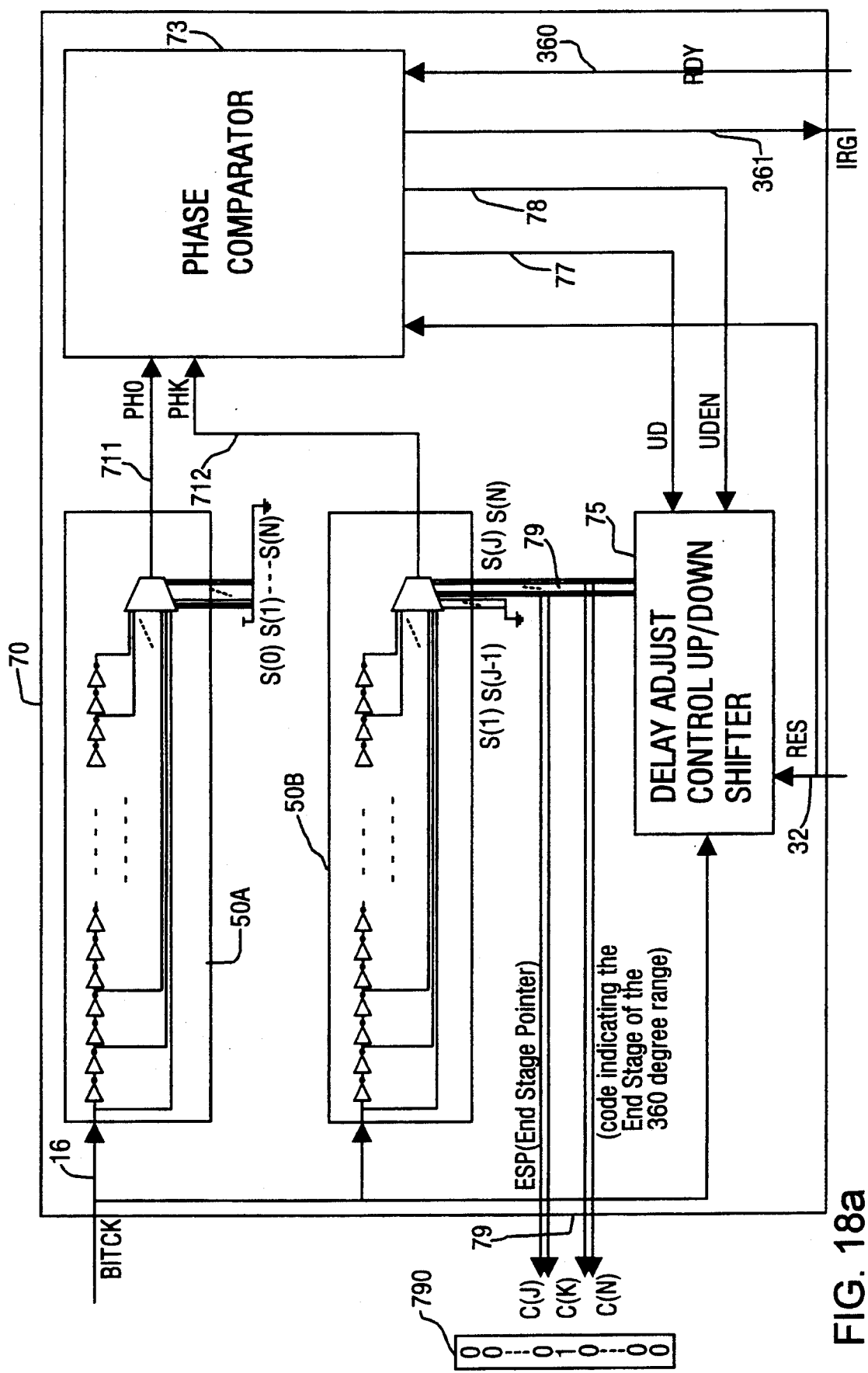
FIG. 18a is the block diagram for the 360 Degree Phase Shift Range Calibrator.
Figure 18B:
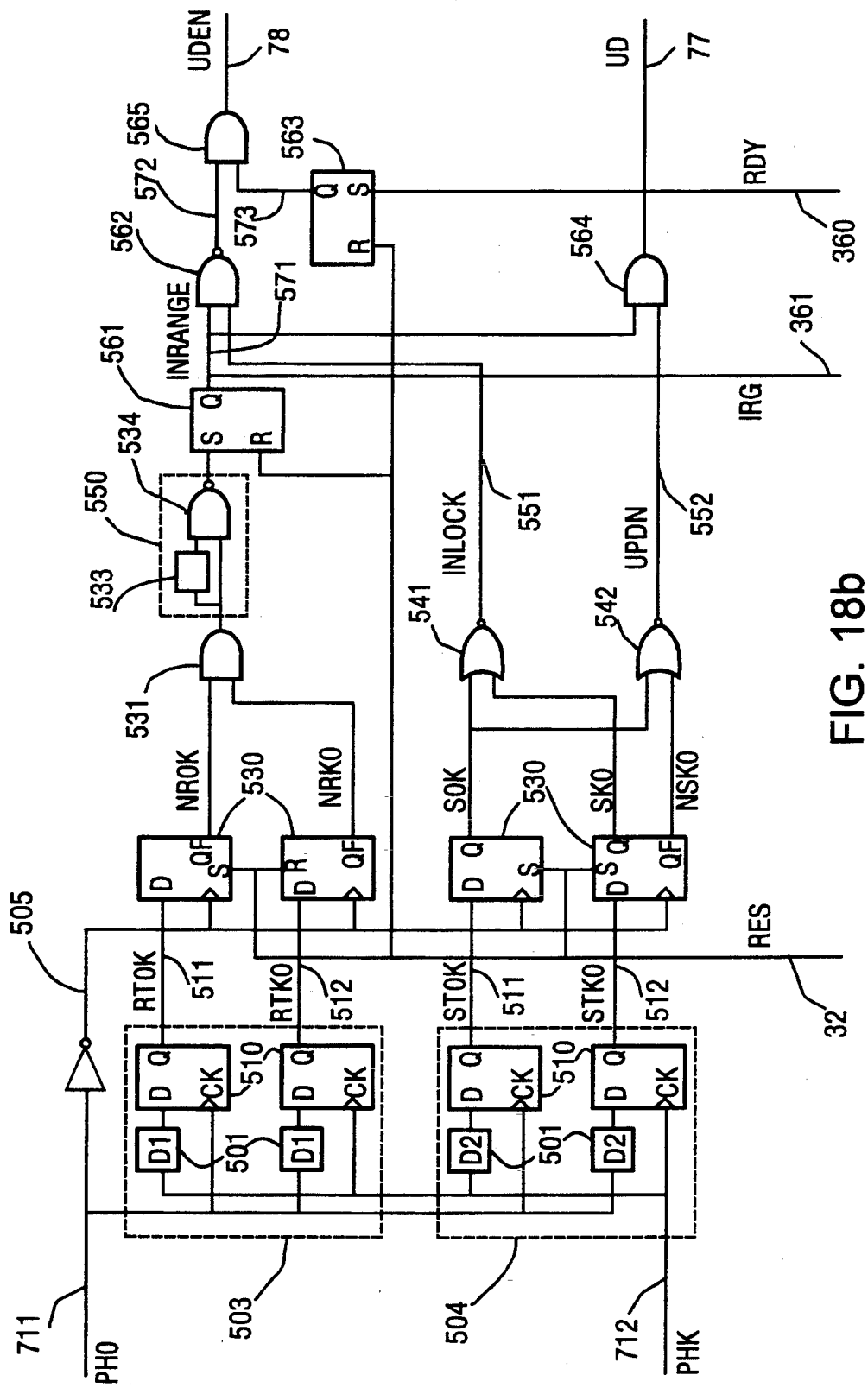

The block diagram of the Phase Shift Range Calibrator 70, FIG. 1b, is shown in FIG. 18. Two digitally adjusted delay's 50A and 50B, constructed exactly the same way as that of 50, FIG. 16, are used to calibrate the delays to find the ESP location. The controls to delay 50A are set such that it selects the first path of the delay by connecting S(0) to "1" while the rest to "0", thus acting as a "dummy" delay. The selection for delay 50B is controlled by parallel digital code 79 from the delay adjust up/down shifter 75 which is in turn controlled by the up/down signal UD 77 and adjust enable signal UDEN 78 from the phase comparator 74. Controls S(J) through S(N) determines the calibration rotation based on the assumption that at least J stages are required to delay a full cycle for a given signal in any process or operating conditions. At initial power-up, the control may be reset to a pre-specified code to select a delay path, which is often not the correct path to delay the full cycle or 360 degree of the signal. The phase difference of delayed signal at PH0 711 and PHK 712 is detected by the phase comparator, and an UD signal is generated to signify the delay adjust control up/down shifter to add or subtract delay stages to reduce the phase difference. If, after a number of adjustments, signal delayed by delay 50A at 711 and signal delayed by 50B at 712 are in phase, the delay path of delay 50B is the path that provides a 360 degree phase shift o the original signal delayed by 50A. The code 79 for selecting this 360 degree delay path contains a single "1", the position of which defines the ESP location, or stage DK corresponding to C(K). The difference of the delay path in 50A and 50B is the delay of pure K delay units consisting of 2K inserters, since the other path delay or the "intrinsic" delays for the two are the same and should be concealed out. The output code 79 (C(J) through C(N) ) contains the ESP information and is used to inform the rotating phase shift control 60, FIG. 1b of the ESP location. The phase comparator circuit 73, FIG. 18B could be any phase detector circuit which detects the phase difference of signal PH0 at 711 and PHK at 712, and which ensures that correct delay adjust control signal UD77 and UDEN 78 are generated such that phase alignment of PH0 711 and PHK 712 is eventually achieved and that the phase difference is 360° or the delay difference is a full cycle of signal BITCK. FIG. 18B is a preferred embodiment of the phase comparator 73 for providing the delay adjust up-down control signal UD 77 and UDEN 78. The phase comparator circuit 73 is more fully described in the simultaneously filed related application, "Digital Variable In-Lock Range Phase Comparator", which has been incorporated herein by reference.

Figure 19:
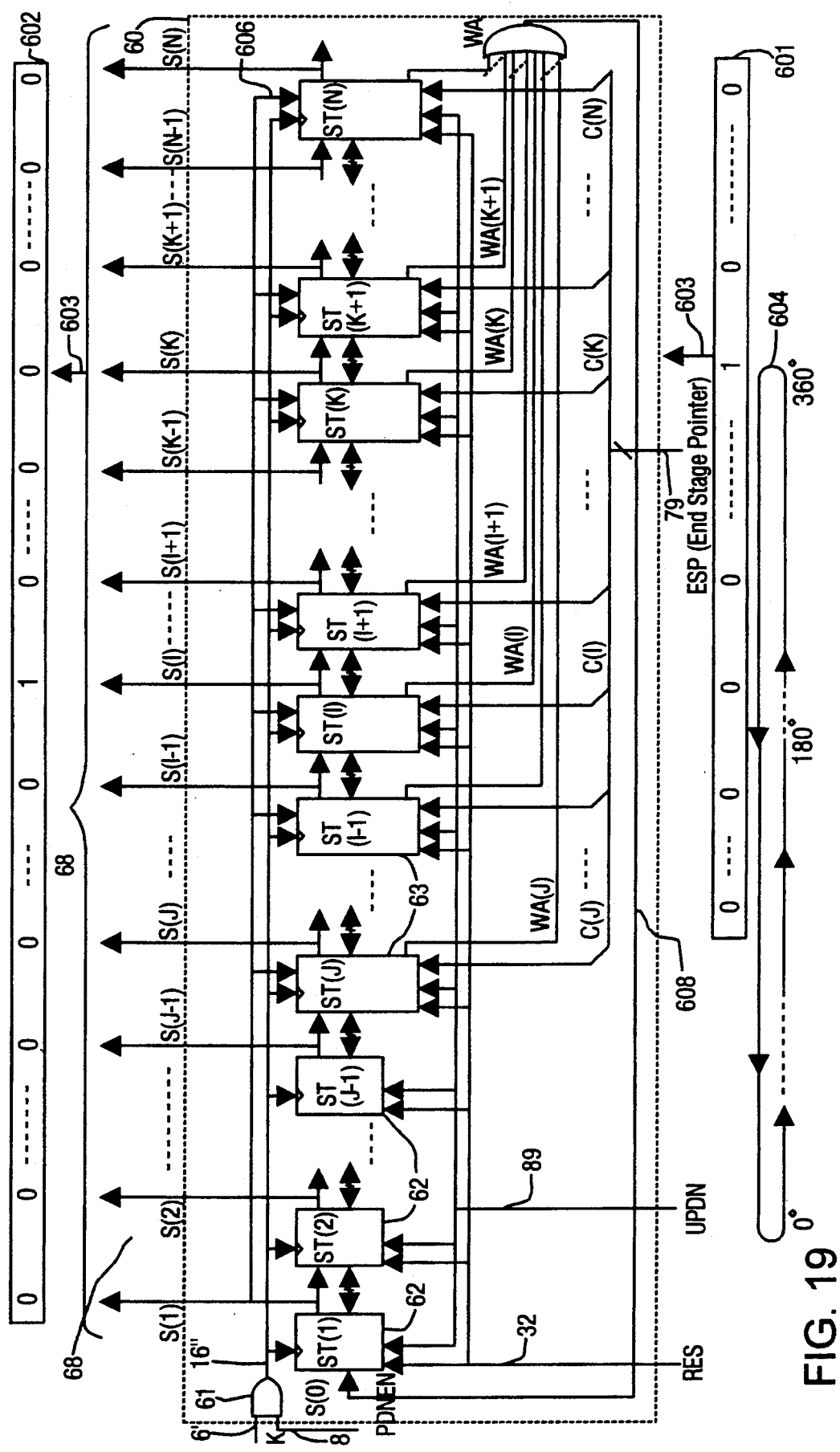
FIG. 19 is the block diagram of one embodiment of the Rotating Phase Shift Control.

FIG. 19 is a detailed block diagram of the Rotating Phase Shift Control 60, FIG. 1b. It contains flip-flop register stages ST(1) through ST(N) to form the control of a bi-directional, 360 degree phase range rotating shifter, where each stage controls the selection of its corresponding delay path in the digital adjustable delay 50, FIG. 1b. If its output is a "1", the delay path or the corresponding MUX in digital adjust delay 50 is selected. After the 360 degree phase shift range calibration, a bus having code 79 is generated from the Phase Shift Range Calibrator 70, FIG. 1b, as described above. The code is shown in box 601 where the location of the "1" is indicated by an arrow 603. In the example shown, stage ST(K) corresponds to the ESP. Positive or "up" incremental phase shift adjustments are executed in a rotational sequence indicated by loop 604. A "1" (indicated in the output code shown in box 602) is shifted to the right at each enable clock CK. This continues until the "1" is shifted to the ESP stage ST(K) such that S(K) becomes a "1". This means that the signal has been phase-shifted for 360 degrees by this code selection. A further positive phase shift request from the decision circuit should cause the "1" to be wrapped around to stage 1, or S(1) will become a "1", and then right-shift again. Note that this rotating shifting takes place in the range of ST(1) through ST(K), as the stage ST(K+1) is "blocked" by the ESP. In practice, when the "1" is shifting while the stage ST(i) is away from the ESP, the detection or the exact location of ESP is not important, and the calibration to find the ESP needs only to be made in relatively long time interval, or when the "1" is approaching the ESP. The error of the 360 degree range calibration due to limited adjustment resolution will cause an uneven adjustment step at the "wrap around", and results in timing jitter on the "phase aligned" or "recovered" clock in terms of data recovery. Negative or "down" decremental phase shift adjustments are executed in opposite direction. Note in FIG. 19, that stages ST(1) through ST(J−1) 62 can be simpler in structure than those of stage ST(J) through ST(N)63, because there is no "wrap around" needed for those stages. As explained previously, in any operation conditions, there is always some minimum number of states required to delay a full cycle of a given frequency signal. Apparently also, the rotation for finding the ESP location needs only be performed for stages ST(J) through ST(N). The clock SBITCK 16' for shift operation is gated by UPDNEN 88. Proper delays 61 are included to ensure that the signal transitions are completed from the stages where the delay path is switching to maintain the signal integrity. Line 606 feeds back the output of S(1) to the ESP stage selected in the event that a "down" or left shift is needed while the "1" has been left-shifted in stage ST(1). A "down wrap around" will have to send this "1" back to the stage where the ESP is located. In normal operations, when a "0" is in ST(1) while a down shift is requested, the "0" is also wrapped around to the ESP stage via the same line 606. Outputs WA(I) of all the register stages 63 are ORed into signal WA or as S(0), which is the input to stage ST(1) in the "up" or right-shift operations. In any event, only one "1" is allowed in all the outputs S(1) through S(N) to ensure that a single phase shifting delay path is enabled. No "1" should be in outputs on right side of the ESP stage ST(K).

Figure 20:
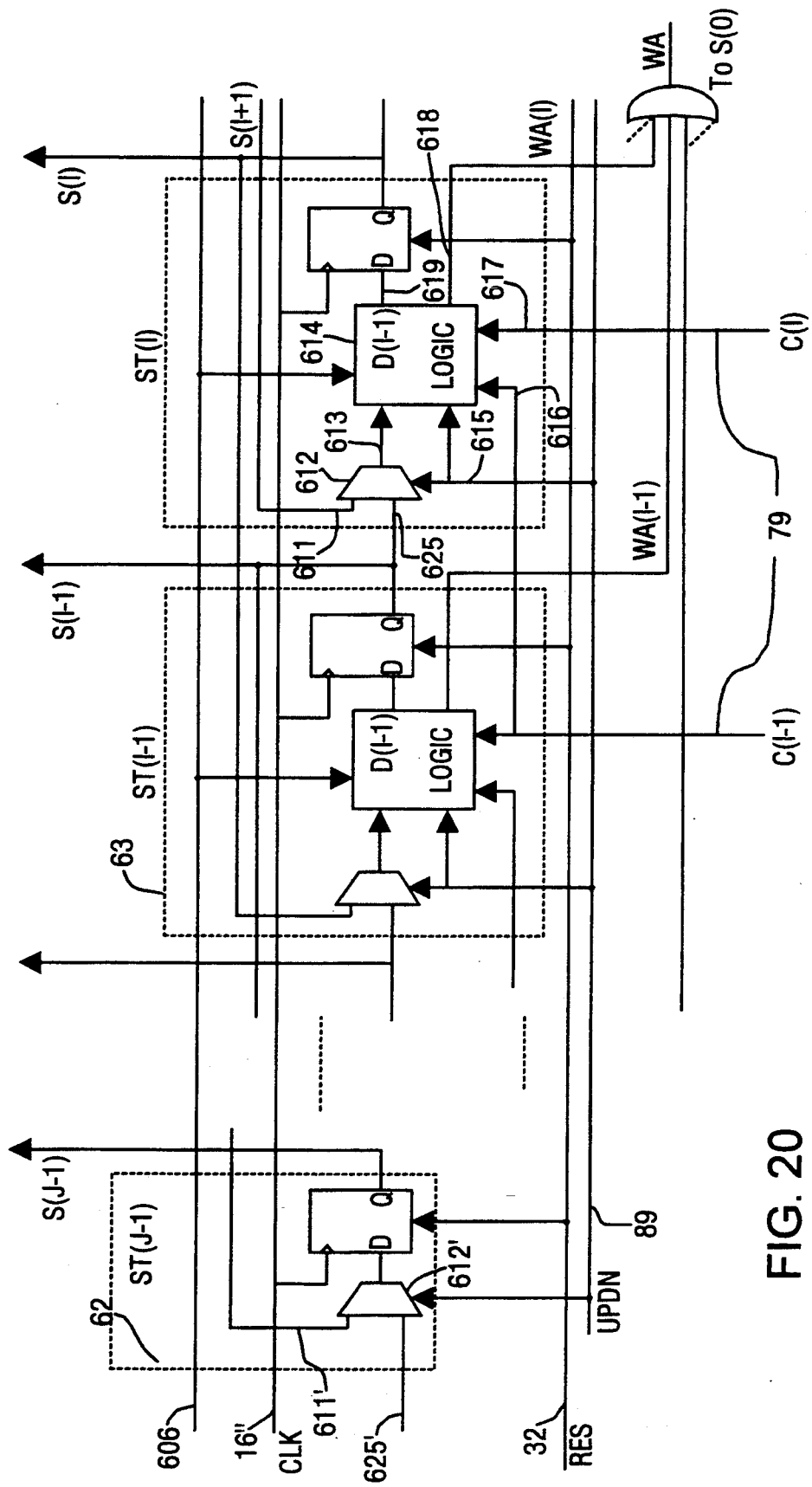
FIG. 20 is the logic diagram for the register stages of FIG. 19.

FIG. 20 shows a preferred embodiment of the register stages in FIG. 19. Register stage 62 is one of the simpler register and is used for stages ST(1) through ST(J−1). Depending on whether UPDN 89 is a "1" or a "0", MUX 612' selects input from the output on left (previous) stage on line 625', or from the output on right (next) on line 611'. When the gated clock CLK 16'' arrives, a "up" or "down" shift is performed. Register stage 63 is the type of register with combinatorial logic used for stage ST(J) through ST(N), FIG. 19. Register stages 63 are the same as register 62 with addition to register function 62 of a logic block 614. It takes the output of MUX 612 on line 613 for selecting inputs from either the previous stage S(I−1) on line 625, or from the next stage S(I−1) on line 611, depending on control UPDN on line 615. Other inputs to the logic are: the inputs 79 from the phase shift range calibrator 70, FIG. 1b and FIG. 19, both for the current stage C(I) on line 617, and for the previous stage on line 616; and input from stage one S(1) on line 606. The logic for FIG. 19 is easier to understand by referring also to FIG. 21, which contains the equations and its truth table for the function. For each register unit ST(I), there are two outputs: S(I), and WA(I). S(I) controls the corresponding input of the digital adjustable delay 50, FIG. 1b WA(I), 608 is the feedback signal to stage one ST(1). In the truth table shown, row 701 through 704 is when "up"-shift is needed (UPDN=1), while row 705 through 708 is when "down"-shift is required. In row 701 and 702, C(I) is a "0", meaning that stage ST(I) is not the ESP stage, so normal shift is performed. The status of the previous stage S(I−1) is transferred to the D input of the D flip-flop D(I), and will be latched in S(I) upon the arrival of the clocking edge of CLK 16'', while input to stage ST(1) or WA(I) is always a "0". Row 703 and 704 is for the situation when ST(I) is the ESP stage (I=K, C(I)=1) or the end stage from which the signal has already been phase-shifted 360 degrees. In row 703, if the previous stage is a "0", the "0" is wrapped around to ST(1) since WA(I) is a "0", while the current stage is the ESP (C(I)=C(K)=1), the "1" is not permitted to move to stage ST(I+1), but rather, has to move to the first stage ST(1). A "wrap around" is performed here by making S(I+1) a "0" upon the next clocking edge of CLK 16''. This can be seen on row 704', where the current stage is the stage following ESP, since C(I−1)=1. During cycle n, if the ESP stage is "1" $(S(I-1)_{(n)}=1)$, for next cycle (n+1), the current stage will be set to "0" $(S(I)_{(n+1)}=0)$, preventing the "1" from shifting beyond ESP. Meanwhile, at the clocking edge of CLK 16'' on cycle n, both $WA(I)_{(n)}$, and $S(I)_{(n)}$ have been set to "1" (row 704), i.e. S(1) will be set to "1" upon the arrival of clocking edge of cycle (n+1), thus completing the "wrap-around" "1" of ESP to stage one or S(1). Row 705 through 708 is for the "down" shift operations (UPDN=0). Row 705 and 706 is similar to the case of row 701 and 702 except that they are left or down shift operations. Row 707 and 708 is the situation when ST(I) is the ESP stage or I=K. This time, whatever is in stage ST(1) will be "wrapped around" to ST(I) (I=K). WA(I) is "don't care" since these are down-shift operations. The equations for S(I) and WA(I) are shown on top of the truth table. At power-up, a reset is made such that all stages are "0" except ST(1) which is a "1", so a minimum phase shift is chosen. Meanwhile, the phase range calibrator resets C(J) to "1" while others to "0", so the stage J is the ESP to start. The ESP is expected to move "up" to its correct position after the phase range calibrator completes certain number of calibration cycles, at which a IN-RANGE signal IRG 361 is generated, and is sent to the Rotating phase shift control block 60, FIG. 1A, to initiate phase adjustment process. The UPDN signal for the delay path selection should choose to up-shift at the start, so a "1" at outputs S(I) is moving "up". In any case, no "1" is allowed to be at the outputs beyond the ESP. Equation (A) is for stage 1 through stage J−1, while equation (B) and (C) are for stage J through stage N. Circuit implementation can be easily achieved by using conventional combinational circuit design methods or by using a logic or circuit synthesizer.

The invention herein has been described in respect to the embodiments of the drawings but other embodiments are contemplated. It is our intention that the scope of the invention is to be controlled by the claims. With this in view.

What is claimed is:

1. An all digital method for tracking and aligning the phase of a binary receiver reference signal to the phase of an incoming serial binary data stream, wherein said incoming serial binary data stream has a bit rate which is derived from a distant asynchronous oscillator having a specified nominal frequency and tolerance, comprising:

sampling the transition edge positions of transitions of said incoming serial binary data stream;

digitally analyzing said transition edge positions to determine the average edge position of said incoming serial binary data stream with reference to a local reference signal by comparing said transition edge positions to a phase adjusted reference signal derived from a local reference signal where said local reference signal has the same said specified nominal frequency and tolerance as said distant asynchronous oscillator;

providing digital command signals to shift the relative phase of said phase adjusted reference signal to reduce the phase difference between said incoming serial binary data signal and said phase adjusted reference Signal, where said step of providing digital command signals to shift the relative phase includes the step of launching a pulse derived from said local reference signal into a multistage delay line to provide said phase adjusted reference signal; and wherein said step of providing digital command signals to shift the relative phase of said phase adjusted reference signal further includes the step of compensating said phase adjusted signal by causing said phase adjusted reference signal to include a frequency spectrum comprised of a plurality of time ruler delay elements having different base frequencies.

2. The method of claim 1 wherein said plurality of time ruler delay elements having different base frequencies includes a first and second frequency, and wherein said first frequency includes a plurality of cycles of equal period and said second frequency includes one cycle of a different period so that the average pulse rate of said local reference signal is equal to the pulse rate of said incoming serial binary data whereby data recovery can be accurately undertaken even in instances of run length of thousands of unchanging value bits in said incoming serial binary data.

3. The method of claim 1 wherein said step of providing digital command signals to shift the relative phase includes the step of delaying said phase adjusted reference signal in a multistage delay line includes, generating an end stage pointer (ESP) indicating which stage of said multistage delay line would provide exactly a 360 degree phase shift of said pulse launched into said delay line.

4. The method of claim 3 wherein said step of providing digital command signals to shift the relative phase includes connecting the output of said stage pointed to by said ESP to the input of the said delay line to feedback the stage selected for phase shift of said phase adjusted reference signal back to said input of said first stage of said delay line whenever the delay needed exceeds 360 degrees in phase.

5. A method for adjusting the phase of a reference clock to track incoming received serial data including a method for analyzing the edge position of binary transitions in said received serial data with respect to said reference clock and determining the average edge position of said received serial data, comprising:

a. initiating a time ruler pulse train upon arrival of transitions of said received serial data by launching a pulse into a serially connected plurality of unit delay elements, each said unit delay element having an input terminal, an intermediate terminal and an output terminal;

b. connecting the input, intermediate and output terminals of said unit delays into an edge distribution analyzer circuit for sampling and analyzing said pulse train;

c. sampling the signal at each said input, intermediate and output terminal at the occurrence of a selected transition of said reference clock;

d. combinatorially interconnecting said sampled signals and said reference clock to provide a running early versus late difference count of the difference between the number of receiver data transitions which are early (E) versus late (L) with respect to said selected transition of said reference clock; and e. analyzing said early versus late difference count to generate a correction signal for adjusting the phase of said reference clock to drive said early minus late (E-L) difference count toward zero, wherein said step of combinatorially interconnecting also provide a running count of the difference between the number of receiver data transitions, I, which are earlier than a first predetermined time and the number of receiver data transition, O, which are later than a second predetermined time, said difference being called I-O difference count; and analyzing said I-O difference count to generate a correction signal for adjusting the phase of said reference clock to drive said I-O difference count toward a positive maximum value.

6. The method of claim 5 wherein said I-O difference count corrects for 180 degree phase shifts and said E-L count corrects for 90 degree phase shifts.

7. The method of claim 6 wherein the minimum E-L count and the maximum I-O count are a measure of the phase alignment in said received serial data.

8. An all digital phase lock loop comprising:

means for sampling the transition edge positions of incoming serial binary data, said incoming serial binary data transition edge positions being derived from a distant clock;

means for generating a broadband time ruler signal;

means for adjustably shifting the phase of said broadband time ruler signal;

means for comparing said shifted broadband time ruler signals to said edge positions of said incoming serial binary data and analyzing the results of said comparison, said means for adjustably shifting said broadband time ruler signal being responsive to said analyzed comparison, wherein said means for comparing provides a statistically averaged transition edge position and said means for adjustably shifting causes the said phase of said broadband time ruler signal to track said statistically averaged transition edge position; and wherein said means for generating a broadband time ruler signal includes;

means for causing said broadband time ruler to have a spectrum containing at least a first and second base frequency, the first said base frequency being the frequency corresponding to the period of a local reference clock multiplied by N, where N is the number of pulses in the compensated broadband time ruler; and wherein the said second base frequency corresponds to the period equal to $T_1+T_2$, where $T_1=1/F_R$ and $T_2=1/F_R-F_T$, where $F_R$ equals the frequency of local reference clock and $F_T$ equals the frequency of said distant clock.

9. The apparatus of claim 8 wherein said means for adjustably shifting said broadband time ruler signal includes a 360 degree phase shifter.

10. The apparatus of claim 9 wherein said 360 degree phase shifter includes a delay line having a long chain of serially connected delay elements and a means to identify exactly at which output in said long chain of serially connected delay elements outputs that a signal in said delay line is exactly in phase with a signal which is launched into the first delay element of said delay line and is propagating in said delay line;

means to mark said identified output in said chain of delay element as the end stage position; and means to cause the output of the first element of said serially connected delay elements to provide the next output delay when a larger delay than is available at said end stage position is requested whereby the long chain of delay elements is wrapped back at the end stage position to the input of said first delay element of said serially connected delay elements.

11. In a binary data receiver apparatus for decoding an incoming serial binary data stream wherein said incoming serial binary data is a two level voltage pulse stream having transitions which are derived from a remote oscillator output signal, said remote oscillator output signal having a specified fixed frequency and tolerance and wherein said apparatus for decoding further includes terminal means for receiving a signal from a local reference oscillator signal derived in said binary data receiver apparatus, said local reference oscillator signal being of the same specified fixed frequency and tolerance as said remote oscillator, said local reference oscillator signal being asynchronously related to said remote oscillator output, the improvement comprising, a digitally variable delay line having outputs;

means for providing a bit clock signal, said bit clock signal having a broadband frequency including a first frequency equal to a multiple of said local reference oscillator signal and a second frequency derived from said delay line outputs, said means for providing a bit clock signal includes means for launching a pulse into said digitally variable delay line once per cycle of said local reference oscillator, said delay line outputs being multiple, displaced output tap terminals, whereby said launched pulse signal propagates in said delay line and whereby signals appear at each of said multiple, displaced delay line output tap terminals and where each said tap terminal signal is a different phase shifted copy of said launched pulse which had been launched into said delay line, and where the time delay between each said tap terminals is equal;

means for sampling the transition edge positions of said transitions of said incoming serial binary data stream;

means for digitally analyzing said transition edge positions to determine the average edge position of said incoming serial binary data stream by comparing said transition edge position to the phase of a shifted version of said bit clock signal, and means for providing digital command signals to select a different phase of said bit clock signal to reduce the phase difference between said incoming serial binary data stream and said bit clock signal.

* * * * *